（12） United States Patent
Sawashima et al.

(10) Patent No.: US 12,145,171 B2
(45) Date of Patent: Nov. 19, 2024

(54) SUBSTRATE TREATING APPARATUS

(71) Applicant: SCREEN Holdings Co., Ltd., Kyoto (JP)

(72) Inventors: Jun Sawashima, Kyoto (JP); Takahiro Yamaguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 498 days.

(21) Appl. No.: 17/575,685

(22) Filed: Jan. 14, 2022

(65) Prior Publication Data

US 2022/0258196 A1   Aug. 18, 2022

(30) Foreign Application Priority Data

Feb. 16, 2021   (JP) ................................. 2021-022362

(51) Int. Cl.
*B05C 5/02*     (2006.01)
*B05C 11/10*    (2006.01)
*B05C 13/02*    (2006.01)

(52) U.S. Cl.
CPC ........ *B05C 5/0208* (2013.01); *B05C 11/1036* (2013.01); *B05C 13/02* (2013.01)

(58) Field of Classification Search
None
See application file for complete search history.

(56) References Cited

U.S. PATENT DOCUMENTS 7,300,524 B2 * 11/2007 Asano ............... H01L 21/67046
                                                              134/33
10,297,475 B2    5/2019 Yamauchi et al. ....... 156/345.12

2006/0003592 A1   1/2006 Gale et al. ................... 438/745
2006/0137726 A1 * 6/2006 Sano ................ H01L 21/67028
                                                              118/696
2012/0305024 A1  12/2012 Kang et al. ....................... 134/1
(Continued)

FOREIGN PATENT DOCUMENTS

CN    102810461 A    12/2012
JP    2010-225935 A  10/2010
(Continued)

OTHER PUBLICATIONS

JP 2010225935 translation, Substrate Processing Apparatus, Kikumoto (Year: 2010).*

(Continued)

*Primary Examiner* — Cristi J Tate-Sims
(74) *Attorney, Agent, or Firm* — OSTROLENK FABER LLP

(57) ABSTRACT

Disclosed is a substrate treating apparatus in which a first treating unit is located rightward of a transportation space. The first treating unit includes a first holder. A second treating unit is located leftward of the transportation space. The second treating unit includes a second holder. The first holder has a center point positioned more rearward than a middle point of the first treating unit in plan view. The second holder has a center point positioned more forward than a middle point of the second treating unit in plan view. The second treating unit has a front end located more rearward than a front end of the first treating unit and more forward than a rear end of the first treating unit. The first liquid reservoir is located leftward of the transportation space and adjacent to and in front of the second treating unit.

20 Claims, 10 Drawing Sheets

(56) References Cited

U.S. PATENT DOCUMENTS

| | | | |
|---|---|---|---|
| 2014/0144462 A1 | 5/2014 | Verhaverbeke et al. ....... | 134/1.2 |
| 2016/0163573 A1 | 6/2016 | Ogura et al. | |
| 2017/0136489 A1 | 5/2017 | Maeda | |
| 2018/0308729 A1 | 10/2018 | Choi et al. | |
| 2020/0098602 A1 | 3/2020 | Inagaki et al. | |

FOREIGN PATENT DOCUMENTS

| | | |
|---|---|---|
| KR | 10-2014-0084733 A | 7/2014 |
| KR | 10-2022-0067619 A | 5/2022 |
| TW | 200610044 A | 3/2006 |
| TW | 201426850 A | 7/2014 |

OTHER PUBLICATIONS

Notice of Allowance dated May 29, 2024 issued in corresponding Korean Patent Application No. 10-2022-0017400.
Taiwanese Notice of Allowance dated Sep. 22, 2023 for corresponding Taiwanese Patent Application No. 111102345.

* cited by examiner

SUBSTRATE TREATING APPARATUS

CROSS-REFERENCE TO RELATED APPLICATIONS

This application claims priority to Japanese Patent Application No. 2021-022362 filed Feb. 16, 2021, the disclosure of which is hereby incorporated herein by reference in its entirety for all purposes.

BACKGROUND OF THE INVENTION

Field of the Invention

The present invention relates to a substrate treating apparatus that performs a treatment to substrates. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

Description of the Related Art

Japanese Unexamined Patent Publication No. 2010-225935A discloses a substrate treating apparatus. The substrate treating apparatus includes an indexer and a treating block. The treating block is located rearward of the indexer.

The treating block includes a transportation space and a center robot. The transportation space extends in a front-back direction. The center robot is provided at a central portion of the transportation space. The center robot is rotatable about a vertical axis. However, the center robot is immovable in parallel in the front-back direction.

The substrate treating apparatus includes a shuttle unit. The shuttle unit is provided in the transportation space. The shuttle unit is located in front of the center robot. The shuttle unit has a substrate placed thereon, the substrate being transported between the indexer and the center robot. The shuttle unit is movable in the front-back direction. When the shuttle unit is moved rearward, the center robot can access the shuttle unit.

The treating block includes a first treating unit, a second treating unit, a third treating unit, and a fourth treating unit. The first treating unit and the third treating unit are arranged on a first lateral side of the transportation space. The third treating unit is located behind the first treating unit. Likewise, the second treating unit and the fourth treating unit are arranged on a second lateral side of the transportation space. The fourth treating unit is located behind the second treating unit.

The second treating unit has a configuration symmetrical to a configuration of the first treating unit. The fourth treating unit has a configuration symmetrical to a configuration of the third treating unit. Accordingly, the center robot can access the first treating unit, the second treating unit, the third treating unit, and the fourth treating unit. Even if the center robot is immovable in parallel in the front-back direction, the center robot can access the first treating unit, the second treating unit, the third treating unit, and the fourth treating unit.

The substrate treating apparatus further includes a liquid reservoir. The liquid reservoir stores a treatment liquid to be distributed to the first to fourth treating units. The liquid reservoir is located behind the transportation space. The liquid reservoir is located behind the first to fourth treating units.

SUMMARY OF THE INVENTION

However, the substrate treating apparatus disclosed in Japanese Unexamined Patent Publication No. 2010-225935A possesses the following drawbacks. As described above, the second treating unit has the configuration symmetrical to the configuration of the first treating unit. Accordingly, the configuration of the second treating unit is similar to but not equal to the configuration of the first treating unit. This easily causes uneven quality of treatment on substrates between the first treating unit and the second treating unit. Moreover, many types of parts are used for manufacturing the first treating unit and the second treating unit.

Likewise, the fourth treating unit has the configuration symmetrical to the configuration of the third treating unit. Accordingly, the configuration of the fourth treating unit is similar to but not equal to the configuration of the third treating unit. This easily causes uneven quality of treatment on substrates between the third treating unit and the fourth treating unit. Moreover, many types of parts are used for manufacturing the third treating unit and the fourth treating unit.

The present invention has been made regarding the state of the art noted above, and its object is to provide a substrate treating apparatus that achieves commonality in configurations of treating units.

To overcome the above drawbacks, Inventors herein have made intensive research. First, the Inventors have made study on a substrate treating apparatus 201 shown in FIG. 10. The substrate treating apparatus 201 includes an indexer 202, and a treating block 203. The treating block 203 is located behind the indexer 202. The treating block 203 includes a transportation space 204, a substrate platform 205, a transport mechanism 206, treating units 207A, 207B, 207C, 207D, and a liquid reservoir 209. The treating units 207A to 207D each have the same construction. The treating units 207A and 207C are arranged rightward of the transportation space 204. The treating units 207B and 207D are arranged leftward of the transportation space 204. The liquid reservoir 209 is located behind the transportation space 204. The liquid reservoir 209 is located behind the treating units 207A, 207B, 207C, 207D.

The treating units 207A to 207D include holders 208A to 208D, respectively. The transport mechanism 206 is movable in parallel in a front-back direction X. The transport mechanism 206 accesses the holders 208A to 208D.

However, the Inventors found that a new drawback arises by the substrate treating apparatus 201 in FIG. 10. Specifically, the new drawback is that a moving distance of the transport mechanism 206 in the front-back direction X is long. The holder 208B is positioned most forward among the holders 208A to 208D. The holder 208C is positioned most rearward among the holders 208A to 208D. FIG. 10 shows a distance M. The distance M is a distance between the holders 208B and 208C in the front-back direction X. The distance M corresponds to the moving distance of the transport mechanism 206 in the front-back direction X when the transport mechanism 206 transports a substrate to the holders 208A to 208D. The distance M is relatively long.

Moreover, the transport mechanism 206 may interfere with the substrate platform 205 when accessing to the holder 208B.

The present invention has been made based on the above study and finding through further studious consideration, and thus is constituted as stated below. One aspect of the present invention provides a substrate treating apparatus. The substrate treating apparatus includes an indexer and a treating block located behind the indexer and is connected to the indexer, the treating block including a transportation space extending in a front-back direction, a transport mechanism located in the transportation space and configured to be movable in parallel in the front-back direction and to transport a substrate, a first treating unit arranged on a first lateral side of the transportation space and configured to treat a substrate, a second treating unit arranged on a second lateral side of the transportation space and configured to treat a substrate, and a first liquid reservoir configured to store a treatment liquid to be distributed to the first treating unit and the second treating unit, the first treating unit including a first holder configured to hold a substrate, and a first liquid supplying unit configured to supply a treatment liquid to a substrate held by the first holder, the second treating unit including a second holder configured to hold a substrate, and a second liquid supplying unit configured to supply a treatment liquid to a substrate held by the second holder, the transport mechanism transporting a substrate to the first holder and the second holder, the first holder having a center point positioned more rearward than a middle point of the first treating unit in plan view, the second holder having a center point positioned more forward than a middle point of the second treating unit in plan view, the second treating unit having a front end located more rearward than a front end of the first treating unit and more forward than a rear end of the first treating unit, and the first liquid reservoir being located on the second lateral side of the transportation space and adjacent to and in front of the second treating unit.

The first treating unit is located on the first lateral side of the transportation space. The first treating unit includes the first holder. The first holder has the center point positioned more rearward than the middle point of the first treating unit in plan view. The second treating unit is located on the second lateral side of the transportation space. The second treating unit includes the second holder. The second holder has the center point positioned more forward than the middle point of the second treating unit in plan view. This can achieve commonality in configurations of the first treating unit and the second treating unit easily. Two treating units having the same configuration may be adopted as the first treating unit and the second treating unit. This can easily suppress uneven quality of treatment on substrates between the first treating unit and the second treating unit.

The transport mechanism transports substrates to the first holder and the second holder. The transport mechanism is configured to be movable in parallel in the front-back direction. This causes the transport mechanism to transport substrates to the first holder and the second holder suitably.

The second treating unit has the front end located more rearward than the front end of the first treating unit. That is, the second treating unit is shifted rearward relative to the first treating unit. The second treating unit has the front end located more forward than the rear end of the first treating unit. Accordingly, the second holder is not located extremely rearward. This suitably reduces a moving distance of the transport mechanism in the front-back direction. Consequently, the transport mechanism can transport a substrate to the first holder and the second holder efficiently. As a result, the first treating unit and the second treating unit can each treat a substrate efficiently.

The first liquid reservoir is located on the second lateral side of the transportation space. The first liquid reservoir is located adjacent to and in front of the second treating unit. In such a manner as above, a space in front of the second treating unit is put to effective use. This achieves suitable suppression of increase in length of the substrate treating apparatus in the front-back direction.

As described above, the substrate treating apparatus according to the present invention can achieve commonality in configurations of the first treating unit and the second treating unit easily. As a result, treatment quality in both the first treating unit and the second treating unit can easily be uniformized. Moreover, the transport mechanism can transport a substrate to the first treating unit and the second treating unit efficiently. This results in suitably enhanced throughput of the substrate treating apparatus. Moreover, this results in suitable suppression of increase in footprint of the substrate treating apparatus.

It is preferred in the substrate treating apparatus described above that the center point of the second holder is located more forward than the center point of the first holder. The second treating unit is not shifted excessively rearward relative to the first treating unit. This achieves suitable suppression of increase in length of the substrate treating apparatus in the front-back direction.

It is preferred in the substrate treating apparatus described above that the first liquid reservoir has a front end located at substantially the same position as the front end of the first treating unit in the front-back direction. This achieves suitable suppression of increase in length of the substrate treating apparatus in the front-back direction.

It is preferred in the substrate treating apparatus described above that the first treating unit is located adjacent to and behind the indexer, and that the first liquid reservoir is located adjacent to and behind the indexer. This achieves suitable suppression of increase in length of the treating block in the front-back direction.

It is preferred in the treating apparatus described above that the second treating unit has a configuration equal to a configuration in which the first treating unit is rotated by 180 degrees about a vertical axis. This achieves uniformized quality of a substrate treatment between the first treating unit and the second treating unit easily.

It is preferred that the substrate treating apparatus described above further includes a substrate platform configured to place thereon a substrate transported between the indexer and the transport mechanism, and that at least part of the substrate platform is located in the transportation space. The substrate treating apparatus includes the substrate platform. Consequently, the transport mechanism can receive a substrate from the indexer easily. The transport mechanism can send a substrate to the indexer easily. At least part of the substrate platform is located in the transportation space. Accordingly, a movable range of the transport mechanism is limited to the rear of the substrate platform. Even in this case, the transport mechanism can transport a substrate to the second holder easily. This is because the second treating unit is shifted rearward relative to the first treating unit.

It is preferred in the substrate treating apparatus described above that the substrate platform is located between the first treating unit and the first liquid reservoir. In other words, it is preferred that the first treating unit, the substrate platform, and the first liquid reservoir are aligned in this order in a transverse direction. Here, the transverse direction is a horizontal direction orthogonal to the front-back direction.

The substrate platform does not prevent the transport mechanism from transporting a substrate to the second holder.

It is preferred that the substrate treating apparatus described above further includes a third treating unit located on the first lateral side of the transportation space and adjacent to and behind the first treating unit and configured to treat a substrate, and a fourth treating unit located on the second lateral side of the transportation space and adjacent to and behind the second treating unit and configured to treat a substrate, the third treating unit including a third holder configured to hold a substrate, and a third liquid supplying unit configured to supply a treatment liquid to a substrate held by the third holder, the fourth treating unit including a fourth holder configured to hold a substrate, and a fourth liquid supplying unit configured to supply a treatment liquid to a substrate held by the fourth holder. The transport mechanism transports a substrate to the third holder and the fourth holder, the first liquid reservoir stores a treatment liquid to be distributed to the third treating unit and the fourth treating units, the third holder has a center point positioned more rearward than a middle point of the third treating unit in plan view, the fourth holder has a center point positioned more forward than a middle point of the fourth treating unit in plan view, and the fourth treating unit has a front end located more rearward than a front end of the third treating unit and more forward than a rear end of the third treating unit.

The third treating unit is located on the first lateral side of the transportation space. The third treating unit includes the third holder. The third holder has the center point positioned more rearward than the middle point of the third treating unit in plan view. The fourth treating unit is located on the second lateral side of the transportation space. The fourth treating unit includes the fourth holder. The fourth holder has the center point positioned more forward than the middle point of the fourth treating unit in plan view. This can achieve commonality in configurations of the first treating unit and the third treating unit easily. This can achieve commonality in configurations of the first treating unit and the fourth treating unit easily. Four treating units having the same configuration may be adopted as the first treating unit, the second treating unit, the third treating unit, and the fourth treating unit. This can easily suppress uneven quality of treatment on substrates among the first to fourth treating units.

The fourth treating unit has the front end located more rearward than the front end of the third treating unit. That is, the fourth treating unit is shifted rearward relative to the third treating unit. The fourth treating unit has the front end located more forward than the rear end of the third treating unit. Accordingly, the third holder is not located extremely rearward. This suitably reduces the moving distance of the transport mechanism in the front-back direction. Consequently, the transport mechanism can transport a substrate to the first to fourth holders efficiently. As a result, the first to fourth treating units can each treat a substrate efficiently.

It is preferred in the treating apparatus described above that the third treating unit has a configuration equal to a configuration of the first treating unit and that the fourth treating unit has a configuration equal to a configuration in which the first treating unit is rotated by 180 degrees about a vertical axis. This achieves uniformized quality of a substrate treatment between the first to fourth treating units easily.

It is preferred that the substrate treating apparatus described above further includes a second liquid reservoir configured to store a treatment liquid to be distributed to the first treating unit, the second treating unit, the third treating unit, and the fourth treating unit, and that the second liquid reservoir is located on the first lateral side of the transportation space and adjacent to and behind the third treating unit. The second liquid reservoir is located on the first lateral side of the transportation space. The second liquid reservoir is located adjacent to and behind the third treating unit. In such a manner as above, a space behind the third treating unit is put to effective use. This achieves suitable suppression of increase in length of the substrate treating apparatus in the front-back direction.

It is preferred in the substrate treating apparatus described above that the second liquid reservoir has a rear end located at substantially the same position as a rear end of the fourth treating unit in the front-back direction. This achieves suitable suppression of increase in length of the substrate treating apparatus in the front-back direction.

It is preferred in the substrate treating apparatus described above that the treatment liquid stored in the second liquid reservoir is different in type from the treatment liquid stored in the first liquid reservoir. The first to fourth treating units can each supply two types of treatment liquids to a substrate.

It is preferred that the substrate treating apparatus described above further includes an upper space formed above the transportation space, the first treating unit, the second treating unit, the third treating unit, the fourth treating unit, the first liquid reservoir, and the second liquid reservoir, a first distributing portion provided in the upper space and configured to distribute a treatment liquid from the first liquid reservoir to the first treating unit, the second treating unit, the third treating unit, and the fourth treating unit, and a second distributing portion provided in the upper space and configured to distribute a treatment liquid from the second liquid reservoir to the first treating unit, the second treating unit, the third treating unit, and the fourth treating unit. The first distributing portion and the second distributing portion are provided in the upper space. This achieves suitable suppression of increase in footprint of the substrate treating apparatus.

It is preferred in the treating apparatus described above that the second distributing portion has a configuration equal to a configuration in which the first distributing portion is rotated by 180 degrees in plan view. A flow path length of the first distributing portion and a flow path length of the second distributing portion are uniformized easily.

It is preferred that the substrate treating apparatus described above further includes a first connecting box located above the first treating unit, a second connecting box located above the second treating unit, a third connecting box located above the third treating unit, and a fourth connecting box located above the fourth treating unit, the first distributing portion extends from the first liquid reservoir to the first connecting box, the second connecting box, the third connecting box, and the fourth connecting box, and the second distributing portion extends from the second liquid reservoir to the first connecting box, the second connecting box, the third connecting box, and the fourth connecting box. The first distributing portion and the second distributing portion both extend to the first connecting box. Likewise, the first distributing portion and the second distributing portion both extend to the second to fourth connecting boxes. Accordingly, the length of flow path in the first distributing portion and the length of flow path in the second distributing portion are uniformized easily.

It is preferred in the substrate treating apparatus described above that the first connecting box is located more forward than the first holder in the front-back direction, the second connecting box is located more rearward than the second holder in the front-back direction, the third connecting box is located more forward than the third holder in the front-back direction, and the fourth connecting box is located more rearward than the fourth holder in the front-back direction. This can suitably reduce a difference between a flow path length from the first liquid reservoir to the first connecting box and a flow path length from the first liquid reservoir to the second connecting box. Likewise, this can suitably reduce a difference between a flow path length from the first liquid reservoir to the third connecting box and a flow path length from the first liquid reservoir to the fourth connecting box. This can suitably reduce a difference between a flow path length from the second liquid reservoir to the first connecting box and a flow path length from the second liquid reservoir to the second connecting box. This can suitably reduce a difference between a flow path length from the second liquid reservoir to the third connecting box and a flow path length from the second liquid reservoir to the fourth connecting box.

It is preferred that the substrate treating apparatus described above further includes a first joint accommodated in the first connecting box and configured to couple the first distributing portion to the first liquid supplying unit, a second joint accommodated in the second connecting box and configured to couple the first distributing portion to the second liquid supplying unit, a third joint accommodated in the third connecting box and configured to couple the first distributing portion to the third liquid supplying unit, and a fourth joint accommodated in the fourth connecting box and configured to couple the first distributing portion to the fourth liquid supplying unit. The first distributing portion can be suitably attached to and detached from the first to fourth liquid supplying units in the first to fourth connecting boxes, respectively.

It is preferred that the substrate treating apparatus described above further includes a substantially flat foot board located in the upper space. A user of the substrate treating apparatus can get on the foot board. Accordingly, the user can perform maintenance on the foot board, for example.

It is preferred in the substrate treating apparatus described above that the foot board is located near the first connecting box, the second connecting box, the third connecting box, and the fourth connecting box. The user can access the first to fourth connecting boxes easily. The user can attach and detach the first and second distributing portions to and from the first to fourth liquid supplying units suitably.

It is preferred in the substrate treating apparatus described above that the foot board extends from the first connecting box to the fourth connecting box while passing between the second connecting box and the third connecting box. The user can move among the first to fourth connecting boxes easily.

It is preferred in the substrate treating apparatus described above that the foot board is located above at least part of the first distributing portion. The foot board protects the first distributing portion suitably.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

The following describes a substrate treating apparatus of the present invention with reference to the drawings.

1. Outline of Substrate Treating Apparatus

Figure 1:
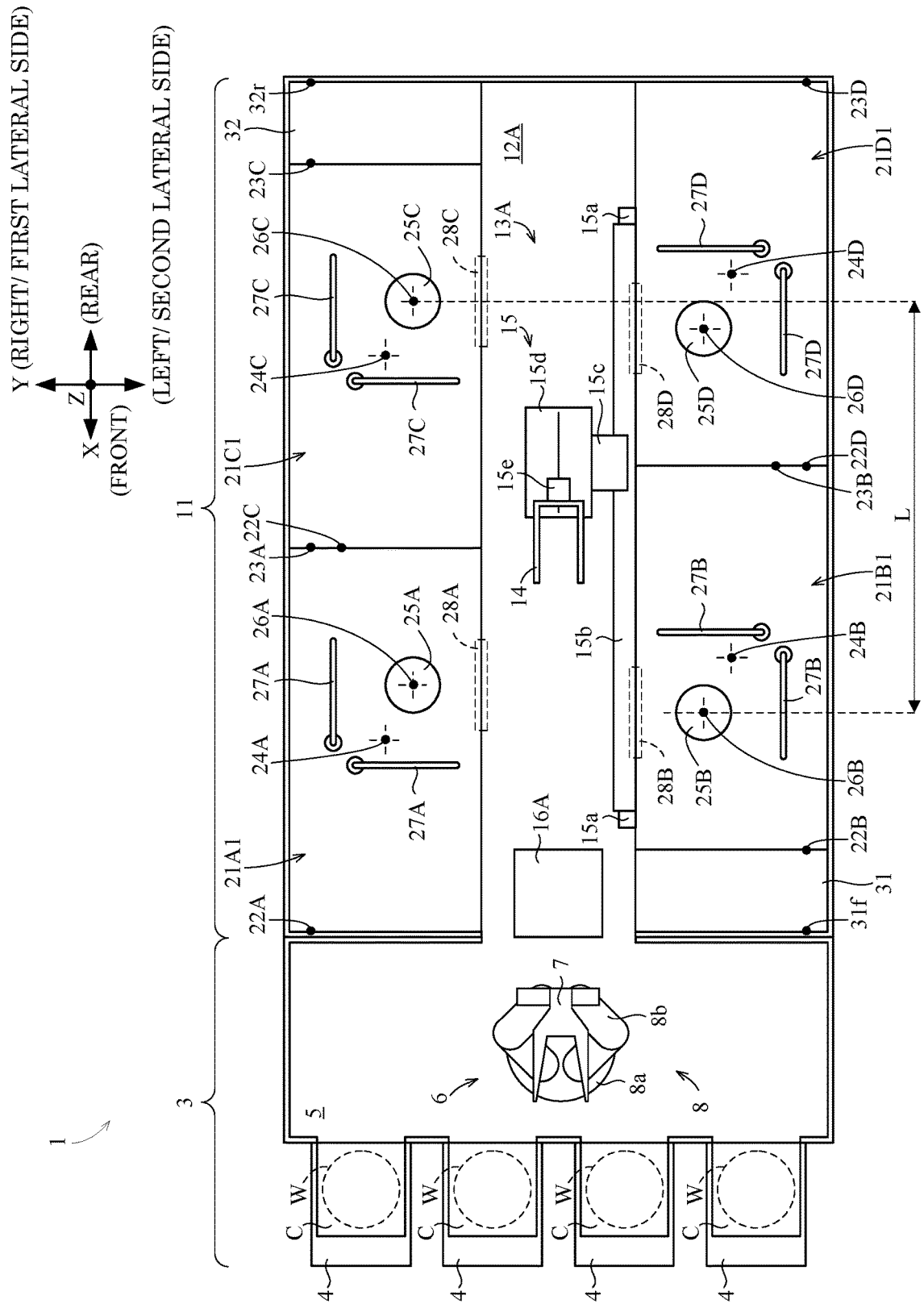
FIG. 1 is a plan view of an interior of a substrate treating apparatus according to one embodiment.

FIG. 1 is a plan view of an interior of a substrate treating apparatus 1 according to one embodiment. A substrate treating apparatus 1 performs a treatment to substrates (e.g., semiconductor wafers) W.

Examples of the substrate W include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate. The substrate W has a thin and flat plate shape. The substrate W has a substantially circular shape in plan view.

The substrate treating apparatus 1 includes an indexer 3, and a treating block 11. The treating block 11 is connected to the indexer 3. The indexer 3 supplies a substrate W to the treating block 11. The treating block 11 performs a treatment to the substrate W. The indexer 3 collects the substrate W from the treating block 11.

In the present specification, the direction in which the indexer 3 and the treating block 11 are arranged is referred to as a "front-back direction X" for convenience. The front-back direction X is horizontal. One direction of the front-back direction X from the treating block 11 to the indexer 3 is referred to as a "forward direction". The direction opposite to the forward direction is referred to as a "rearward direction".

The treating block 11 is located behind the indexer 3.

In the present specification, a horizontal direction orthogonal to the front-back direction X is referred to as a "transverse direction Y". Moreover, one direction of the transverse direction Y is referred to as a "rightward direction" appropriately. The direction opposite to the rightward direction is referred to as a "leftward direction". The perpendicular direction relative to the horizontal direction is referred to as a "vertical direction Z". For reference, the drawings show front, rear, right, left, up, and down, as appropriate.

The rightward direction is one example of a first lateral side in the present invention. The leftward direction is one example of a second lateral side in the present invention.

The indexer 3 includes a plurality of (e.g., four) carrier platforms 4. The carrier platforms 4 are arranged side by side in the transverse direction Y. The carrier platforms 4 each include one carrier C placed thereon. The carrier C accommodates a plurality of substrates W. The carrier C is, for example, a front opening unified pod (FOUP).

The indexer 3 includes a transportation space 5. The transportation space 5 is located behind the carrier platforms 4.

The indexer 3 includes a transport mechanism 6. The transport mechanism 6 is located in the transportation space 5. The transport mechanism 6 is installed behind the carrier platforms 4. The transport mechanism 6 transports substrates W. The transport mechanism 6 is accessible to the carriers C placed on the carrier platforms 4, respectively.

The following describes a configuration of the transport mechanism 6. The transport mechanism 6 includes a hand 7 and a hand driving unit 8. The hand 7 supports one substrate W in a horizontal posture. The hand driving unit 8 is coupled to the hand 7. The hand driving unit 8 moves the hand 7.

The following exemplifies a configuration of the hand driving unit 8. The hand driving unit 8 includes a first driving unit 8a and a second driving unit 8b. The first driving unit 8a is itself immovable in the horizontal direction. The first driving unit 8a supports the second driving unit 8b. The first driving unit 8a moves the second driving unit 8b in the vertical direction Z. The first driving unit 8a also rotates the second driving unit 8b around a rotation axis parallel to the vertical direction Z. The second driving unit 8b supports the hand 7. The second driving unit 8b causes the hand 7 to reciprocate in the horizontal direction with respect to the first driving unit 8a. The second driving unit 8b is composed of an articulated arm, for example.

With the hand driving unit 8 described above, the hand 7 is movable in the vertical direction Z. The hand 7 is movable in the horizontal direction. The hand 7 is rotatable in a horizontal plane.

The treating block 11 includes a transportation space 12A. The transportation space 12A extends in the front-back direction X. A front part of the transportation space 12A is in connection with the transportation space 5 of the indexer 3. The transportation space 12A is located at a central portion of the treating block 11 in the transverse direction Y.

The treating block 11 includes a transport mechanism 13A. The transport mechanism 13A is installed in the transportation space 12A. The transport mechanism 13A is movable in parallel in the front-back direction X. In other words, the transport mechanism 13A is configured to perform translational movement in the front-back direction X. The transport mechanism 13A transports substrates W.

The transport mechanism 13A includes a hand 14 and a hand driving unit 15. The hand 14 supports one substrate W in a horizontal posture. The hand driving unit 15 is coupled to the hand 14. The hand driving unit 15 moves the hand 14. The hand driving unit 15 moves the hand 14 in the front-back direction X, transverse direction Y, and vertical direction Z.

The following exemplifies a configuration of the hand driving unit 15. The hand driving unit 15 includes two struts 15a, a vertical moving portion 15b, a horizontal moving portion 15c, a rotator 15d, and an advancing/retreating portion 15e, for example. The struts 15a are fixedly installed. The struts 15a are arranged on a lateral side of the transportation space 12A. The two struts 15a align in the front-back direction X. The struts 15a each extend in the vertical direction Z. The struts 15a each support the vertical moving portion 15b. The vertical moving portion 15b extends between the two struts 15a in the front-back direction X. The vertical moving portion 15b moves in parallel in the vertical direction Z with respect to the struts 15a. The vertical moving portion 15b supports the horizontal moving portion 15c. The horizontal moving portion 15c moves in parallel in the front-back direction X with respect to the vertical moving portion 15b. The horizontal moving portion 15c supports the rotator 15d. The rotator 15d rotates with respect to the horizontal moving portion 15c. The rotator 15d rotates around a rotation axis that is parallel to the vertical direction Z. The rotator 15d supports the advancing/retreating portion 15e. The advancing/retreating portion 15e supports the hand 14. The advancing/retreating portion 15e causes the hand 14 to reciprocate with respect to the rotator 15d. The advancing/retreating portion 15e reciprocates the hand 14 in a horizontal direction defined by the orientation of the rotator 15d.

Such the hand driving unit 15 described above can move the hand 14 in parallel in the vertical direction Z. The hand 14 is movable in parallel in the front-back direction X. The hand 14 is rotatable in a horizontal plane. The hand 14 can reciprocate with respect to the rotator 15d.

The substrate treating apparatus 1 includes a substrate platform 16A. The substrate platform 16A places thereon a substrate W transported between the indexer 3 and the transport mechanism 13A. Specifically, the substrate platform 16A places thereon a substrate W transported between the transport mechanism 6 and the transport mechanism 13A. The transport mechanism 6 is accessible to the substrate platform 16A. The transport mechanism 13A is also accessible to the substrate platform 16A.

The substrate platform 16A is fixedly installed.

The substrate platform 16A is located behind the transport mechanism 6. The substrate platform 16A is located in front of the transport mechanism 13A. An area where the transport mechanism 13A is movable is limited to a position behind the substrate platform 16A.

At least part of the substrate platform 16A is installed in the transportation space 12A. For example, the substrate platform 16A is entirely installed in the transportation space 12A.

The treating block 11 includes a first treating unit 21A1, a second treating unit 21B1, a third treating unit 21C1, and a fourth treating unit 21D1. The first treating unit 21A1 and the third treating unit 21C1 are each arranged rightward of the transportation space 12A. The third treating unit 21C1 is located adjacent to and behind the first treating unit 21A1. Specifically, the third treating unit 21C1 is located behind the first treating unit 21A1. The third treating unit 21C1 is located adjacent to the first treating unit 21A1. The third treating unit 21C1 contacts a rear part of the first treating unit 21A1, for example. The second treating unit 21B1 and the fourth treating unit 21D1 are each arranged leftward of the transportation space 12A. The fourth treating unit 21D1 is located adjacent to and behind the second treating unit 21B1. The first to fourth treating units 21A1 to 21D1 each perform treatment on a substrate W.

The second treating unit 21B1 is shifted rearward relative to the first treating unit 21A1. Specifically, the first treating unit 21A1 has a front end 22A and a rear end 23A. The second treating unit 21B1 has a front end 22B and a rear end 23B. The front end 22B is located more rearward than the front end 22A in the front-back direction X. The front end 22B is located more forward than the rear end 23A in the front-back direction X. The rear end 23B is located more rearward than the rear end 23A in the front-back direction X.

The fourth treating unit 21D1 is shifted rearward relative to the third treating unit 21C1. Specifically, the third treating unit 21C1 has a front end 22C and a rear end 23C. The fourth treating unit 21D1 has a front end 22D and a rear end 23D. The front end 22D is located more rearward than the front end 22C in the front-back direction X. The front end 22D is located more forward than the rear end 23C in the front-back direction X. The rear end 23D is located more rearward than the rear end 23C in the front-back direction X.

The first treating unit 21A1 is located adjacent to and behind the indexer 3.

At least part of the substrate platform 16A is located more rearward than the front end 22A of the first treating unit 21A1 in the front-back direction X. For example, the substrate platform 16A is entirely located more rearward than the front end 22A of the first treating unit 21A1 in the front-back direction X.

At least part of the second treating unit 21B1 is located more rearward than the substrate platform 16A in the front-back direction X. For example, the second treating unit 21B1 is entirely located more rearward than the substrate platform 16A in the front-back direction X.

The first treating unit 21A1 includes a first holder 25A and a first liquid supplying unit 27A. The first holder 25A holds a substrate W. The first liquid supplying unit 27A supplies a treatment liquid to the substrate W held by the first holder 25A.

Likewise, the second treating unit 21B1 includes a second holder 25B and a second liquid supplying unit 27B. The second holder 25B holds a substrate W. The second liquid supplying unit 27B supplies a treatment liquid to the substrate W held by the second holder 25B.

The third treating unit 21C1 includes a third holder 25C and a third liquid supplying unit 27C. The third holder 25C holds a substrate W. The third liquid supplying unit 27C supplies a treatment liquid to the substrate W held by the third holder 25C.

The fourth treating unit 21D1 includes a fourth holder 25D and a fourth liquid supplying unit 27D. The fourth holder 25D holds a substrate W. The fourth liquid supplying unit 27D supplies a treatment liquid to the substrate W held by the fourth holder 25D.

Here, the first liquid supplying unit 27A does not supply any treatment liquids to the substrates W held by the second to fourth holders 25B to 25D. The first liquid supplying unit 27A supplies a treatment liquid to only the substrate W held by the first holder 25A. The same is applicable to the second to fourth liquid supplying units 27B to 27D as the first liquid supplying unit 27A.

The transport mechanism 13A transports substrates W to the first to fourth holders 25A to 25D.

The first treating unit 21A1 includes a first transportation port 28A. FIG. 1 shows the first transportation port 28A 1 with dotted lines for convenience. The first transportation port 28A faces the transportation space 12A. A substrate W can pass through the first transportation port 28A. When the transport mechanism 13A transports the substrate W to the first holder 25A, the transport mechanism 13A causes the substrate W to enter the first transportation port 28A. Likewise, the second treating unit 21B1, the third treating unit 21C1, and the fourth treating unit 21D1 include a second transportation port 28B, a third transportation port 28C, and a fourth transportation port 28D, respectively.

The first holder 25A is near the rear end 23A of the first treating unit 21A1. Specifically, the first treating unit 21A1 has a middle point 24A in plan view. The middle point 24A is equidistant from the front end 22A and the rear end 23A. The first holder 25A has a center point 26A in plan view. The center point 26A is positioned more rearward than the middle point 24A in plan view.

The second holder 25B is near the front end 22B of the second treating unit 21B1. Specifically, the second treating unit 21B1 has a middle point 24B in plan view. The middle point 24B is equidistant from the front end 22B and the rear end 23B. The second holder 25B has a center point 26B in plan view. The center point 26B is positioned more forward than the middle point 24B in plan view.

The third holder 25C is near the rear end 23C of the third treating unit 21C1. Specifically, the third treating unit 21C1 has a middle point 24C in plan view. The middle point 24C is equidistant from the front end 22C and the rear end 23C. The third holder 25C has a center point 26C in plan view. The center point 26C is positioned more rearward than the middle point 24C in plan view.

The fourth holder 25D is near the front end 22D of the fourth treating unit 21D1. Specifically, the fourth treating unit 21D1 has a middle point 24D in plan view. The middle point 24D is equidistant from the front end 22D and the rear end 23D. The fourth holder 25D has a center point 26D in plan view. The center point 26D is positioned more forward than the middle point 24D in plan view.

Here, the second holder 25B is located more forward than the first holder 25A in the front-back direction X. The center point 26B of the second holder 25B is located more forward than the center point 26A of the first holder 25A in the front-back direction X. The fourth holder 25D is located more forward than the third holder 25C in the front-back direction X. The center point 26D of the fourth holder 25D is located more forward than the center point 26C of the third holder 25C in the front-back direction X. The second holder 25B is located most forward among the first to fourth holders 25A to 25D in the front-back direction X. The third holder 25C is located most rearward among the first to fourth holders 25A to 25D in the front-back direction X.

The second holder 25B is located more rearward than the substrate platform 16A in the front-back direction X. Specifically, the second holder 25B is entirely located more rearward than the substrate platform 16A in the front-back direction X. The first holder 25A is also located more rearward than the substrate platform 16A in the front-back direction X.

FIG. 1 shows a distance L. The distance L is a distance between the center point 26B and center point 26C in the front-back direction X. The distance L corresponds to a moving distance of the transport mechanism 13A in the front-back direction X when transporting substrates W to the first to fourth holders 25A to 25D.

The second treating unit 21B1 has a configuration equal to a configuration in which the first treating unit 21A1 is rotated by 180 degrees about a vertical axis. Accordingly, the second treating unit 21B1 has the configuration common to the configuration of the first treating unit 21A1. Specifically, an arrangement of the second holder 25B, the second liquid supplying unit 27B, and the second transportation port 28B is congruent with an arrangement of the first holder 25A, the first liquid supplying unit 27A, and the first transportation port 28A.

The third treating unit 21C1 has a configuration equal to the configuration of the first treating unit 21A1. That is, the third treating unit 21C1 has the configuration common to the configuration of the first treating unit 21A1. Specifically, an arrangement of the third holder 25C, the third liquid supplying unit 27C, and the third transportation port 28C is congruent with an arrangement of the first holder 25A, the first liquid supplying unit 27A, and the first transportation port 28A.

The fourth treating unit 21D1 has a configuration equal to the configuration in which the first treating unit 21A1 is rotated by 180 degrees about a vertical axis. Accordingly, the fourth treating unit 21D1 has the configuration common to the configuration of the first treating unit 21A1. Specifically, an arrangement of the fourth holder 25D, the fourth liquid supplying unit 27D, and the fourth transportation port 28D is congruent with an arrangement of the first holder 25A, the first liquid supplying unit 27A, and the first transportation port 28A.

The treating block 11 has a first liquid reservoir 31. The first liquid reservoir 31 is located leftward of the transportation space 12A. The first liquid reservoir 31 is located adjacent to and in front of the second treating unit 21B1. The first liquid reservoir 31 stores a treatment liquid to be distributed tor the first to fourth treating units 21A1 to 21D1.

The first liquid reservoir 31 has a front end 31f. The front end 31f is located at a position substantially equal to the front end 22A of the first treating unit 21A1 in the front-back direction Y.

The first liquid reservoir 31 is located adjacent to and behind the indexer 3.

The substrate platform 16A is located between the first treating unit 21A1 and the first liquid reservoir 31. The first treating unit 21A1, the substrate platform 16A, and the first liquid reservoir 31 are arranged in the transverse direction Y in this order.

The treating block 11 has a second liquid reservoir 32. The second liquid reservoir 32 is located rightward of the transportation space 12A. The second liquid reservoir 32 is located adjacent to and behind the third treating unit 21C1. The second liquid reservoir 32 stores a treatment liquid to be distributed to the first to fourth treating units 21A1 to 21D1.

The second liquid reservoir 32 has a rear end 32r. The rear end 32r is located at a position substantially equal to the rear end 23D of the fourth treating unit 21D1 in the front-back direction Y.

The treatment liquid stored in the second liquid reservoir 32 is different in type from the treatment liquid stored in the first liquid reservoir 31. The second liquid reservoir 32 stores the treatment liquid that is different in type from the treatment liquid stored in the first liquid reservoir 31. The treatment liquid stored in the second liquid reservoir 32 is different in composition from the treatment liquid stored in the first liquid reservoir 31. The second liquid reservoir 32 stores the treatment liquid that is different in composition from the treatment liquid stored in the first liquid reservoir 31.

Specifically, the treatment liquid stored in the first liquid reservoir 31 corresponds to a first treatment liquid. The first treatment liquid is classified to an acid liquid, for example. The first treatment liquid includes, for example, at least one selected from hydrofluoric acid, a hydrochloric acid/hydrogen peroxide solution, sulfuric acid, a sulfuric acid/hydrogen peroxide solution, fluoro-nitric acid (a mixed liquid of hydrofluoric acid and nitric acid), and hydrochloric acid.

The treatment liquid stored in the second liquid reservoir 32 corresponds to a second treatment liquid. The second treatment liquid is classified to an organic liquid, for example. The organic liquid includes at least one selected from isopropyl alcohol (IPA), methanol, ethanol, hydrofluoroether (HFE), and acetone.

2. Configuration of Treating Block 11

Figure 2:
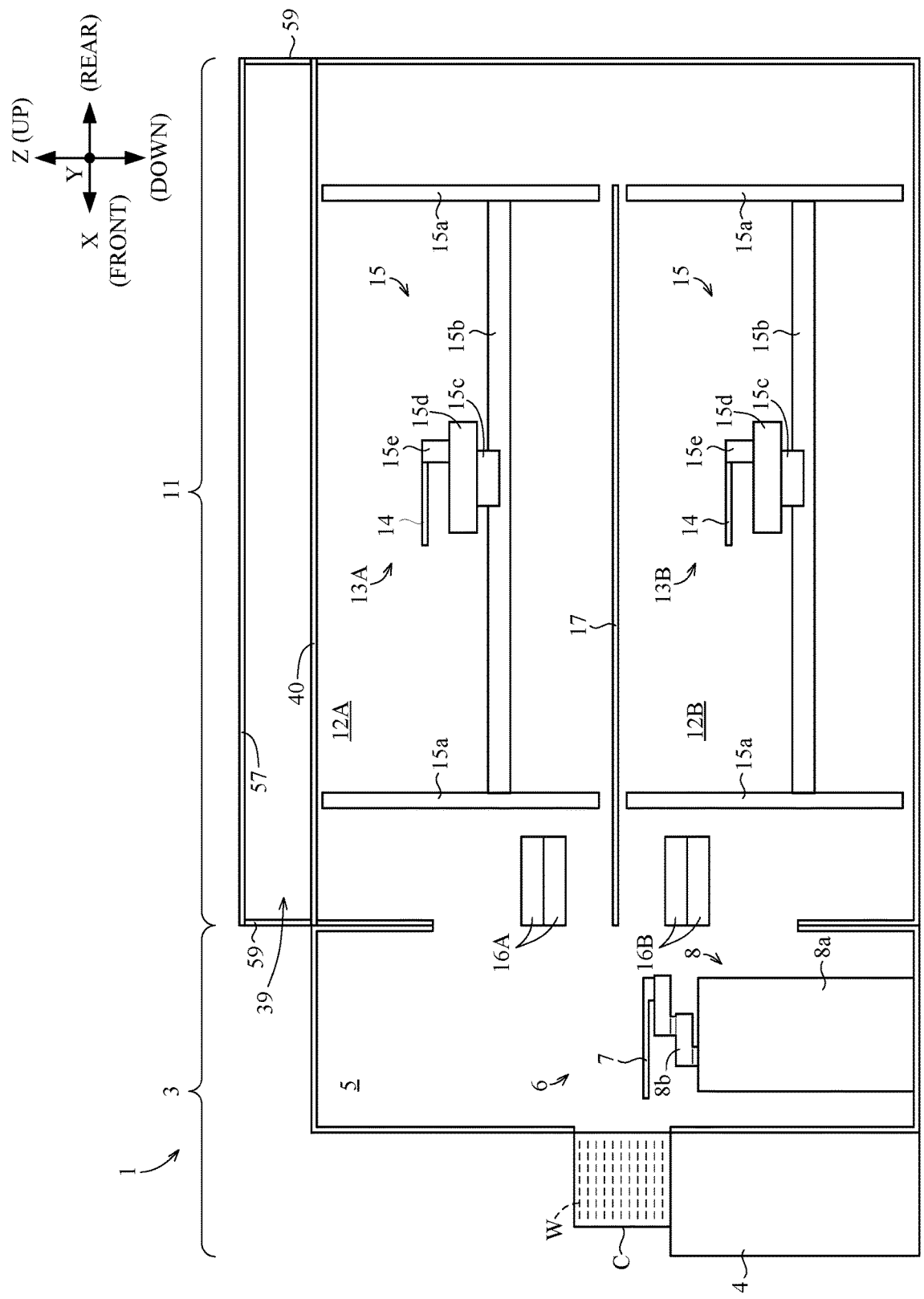
FIG. 2 is a left side view showing a central portion of the substrate treating apparatus in a transverse direction.
Figure 3:
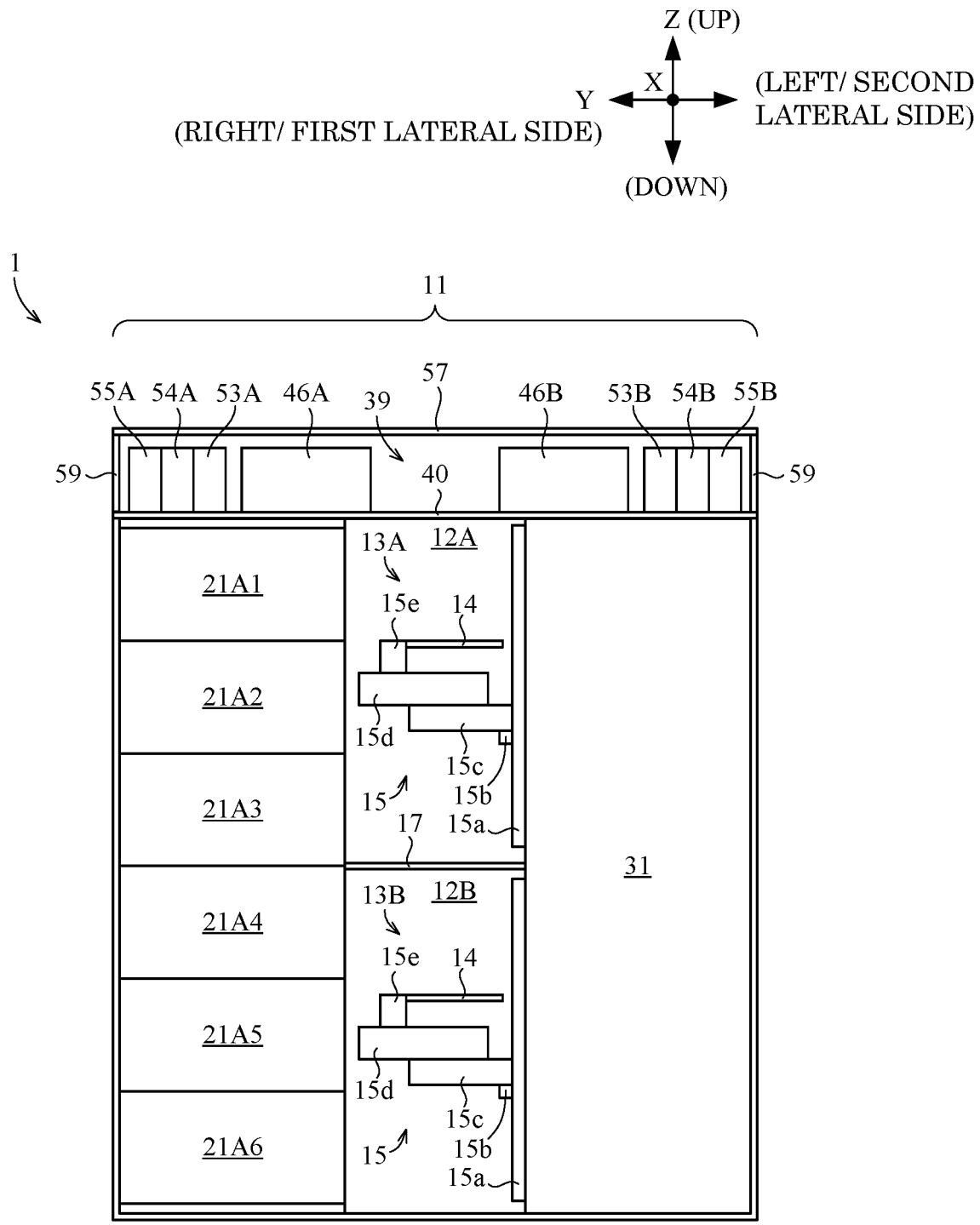
FIG. 3 is a front view of a treating block.

FIG. 2 is a left side view showing a central portion of the substrate treating apparatus in the transverse direction. FIG. 3 is a front view of the treating block. The treating block 11 includes a transportation space 12B in addition to the transportation space 12A. The transportation space 12B is located below the transportation space 12A. The transportation space 12B is also in connection with the transportation space 5 of the indexer 3. The transportation space 12B is located at the same position as that of the transportation space 12A in plan view.

The treating block 11 includes one partition 17. The partition 17 is located below the transportation space 12A and above the transportation space 12B. The partition 17 has a horizontal plate shape. The partition 17 separates the transportation space 12A from the transportation space 12B.

The treating block 11 includes a transport mechanism 13B in addition to the transport mechanism 13A. The transport mechanism 13B is installed in the transportation space 12B. The transport mechanism 13B is installed below the transport mechanism 13A. The transport mechanism 13B is movable in parallel in the front-back direction X. The transport mechanism 13B transports substrates W. The transport mechanism 13B has the same configuration as that of the transport mechanism 13A. Specifically, the transport mechanism 13B also includes a hand 14 and a hand driving unit 15.

The treating block 11 includes a substrate platform 16B in addition to the substrate platform 16A. The substrate platform 16B places thereon a substrate W transported between the indexer 3 and the transport mechanism 13B. The transport mechanisms 6 and 13B are each accessible to the substrate platform 16B. The substrate platform 16B is located below the substrate platform 16A. The substrate platform 16B is located at the same position as that of the substrate platform 16A in plan view.

Figure 4:
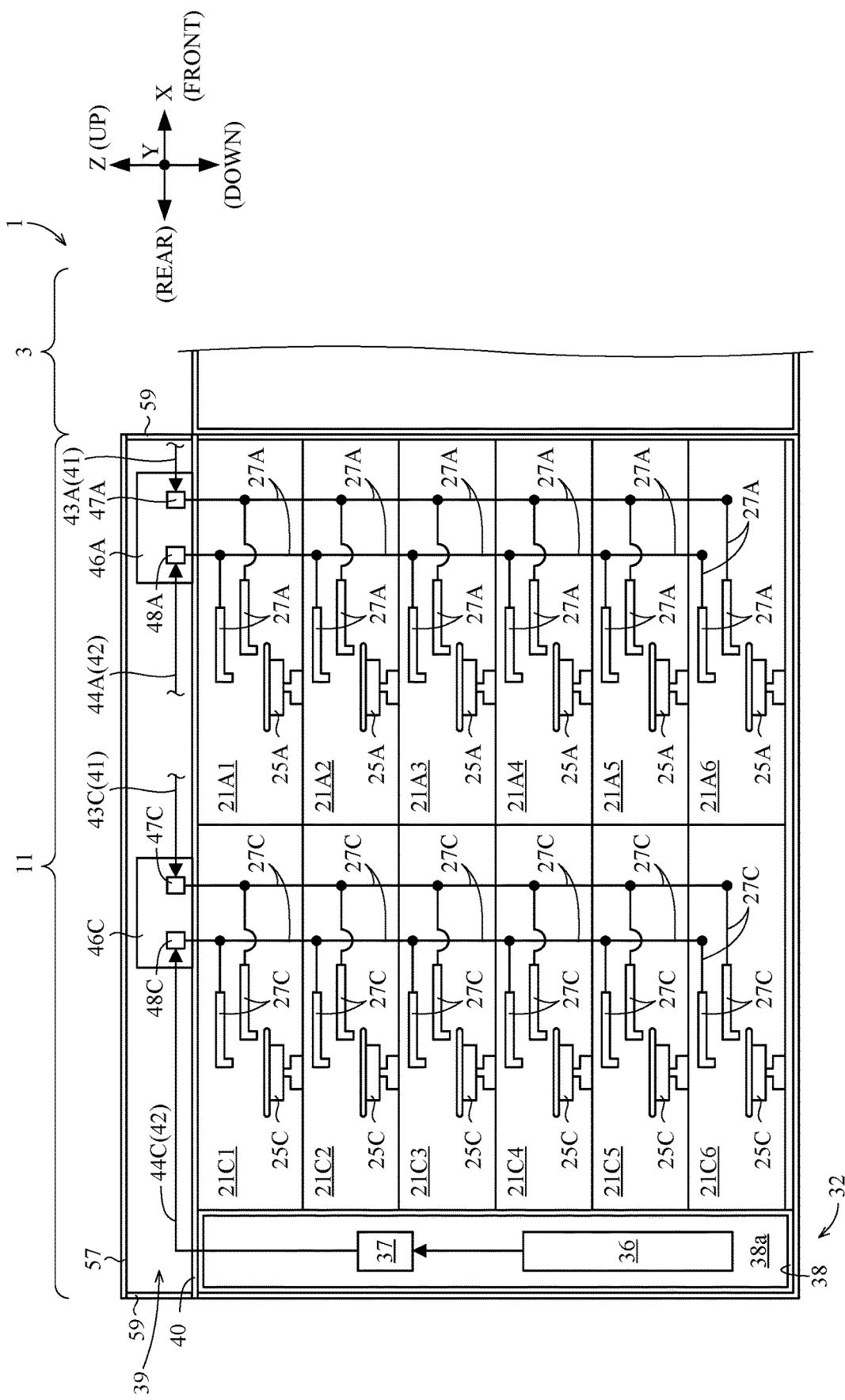
FIG. 4 is a right side view of a right part of the substrate treating apparatus.

Reference is made to FIGS. 3 and 4. FIG. 4 is a right side view of a right part of the substrate treating apparatus 1. The treating block 11 includes five first treating units 21A2 to 21A6 in addition to the first treating unit 21A1. The first treating units 21A2 to 21A6 each have a configuration equal to the configuration of the first treating unit 21A1.

The first treating units 21A1 to 21A6 align in line in the vertical direction Z. The first treating units 21A1 to 21A6 are stacked. The first treating units 21A1 to 21A3 are arranged at the same height position as that of the transportation space 12A. The transport mechanism 13A transports the substrates W to the first treating units 21A1 to 21A3. The first treating units 21A4 to 21A6 are arranged below the first treating units 21A1 to 21A3. The first treating units 21A4 to 21A6 are arranged at the same height position as that of the transportation space 12B. The transport mechanism 13B transports the substrates W to the first treating units 21A4 to 21A6.

Reference is made to FIG. 4. The treating block 11 includes five third treating units 21C2 to 21C6 in addition to the third treating unit 21C1. The third treating units 21C2 to 21C6 each have a configuration equal to the configuration of the first treating unit 21A1.

The third treating units 21C1 to 21C6 align in line in the vertical direction Z. The third treating units 21C1 to 21C6 are stacked. The third treating units 21C4 to 21C6 are arranged below the third treating units 21C1 to 21C3.

Figure 5:
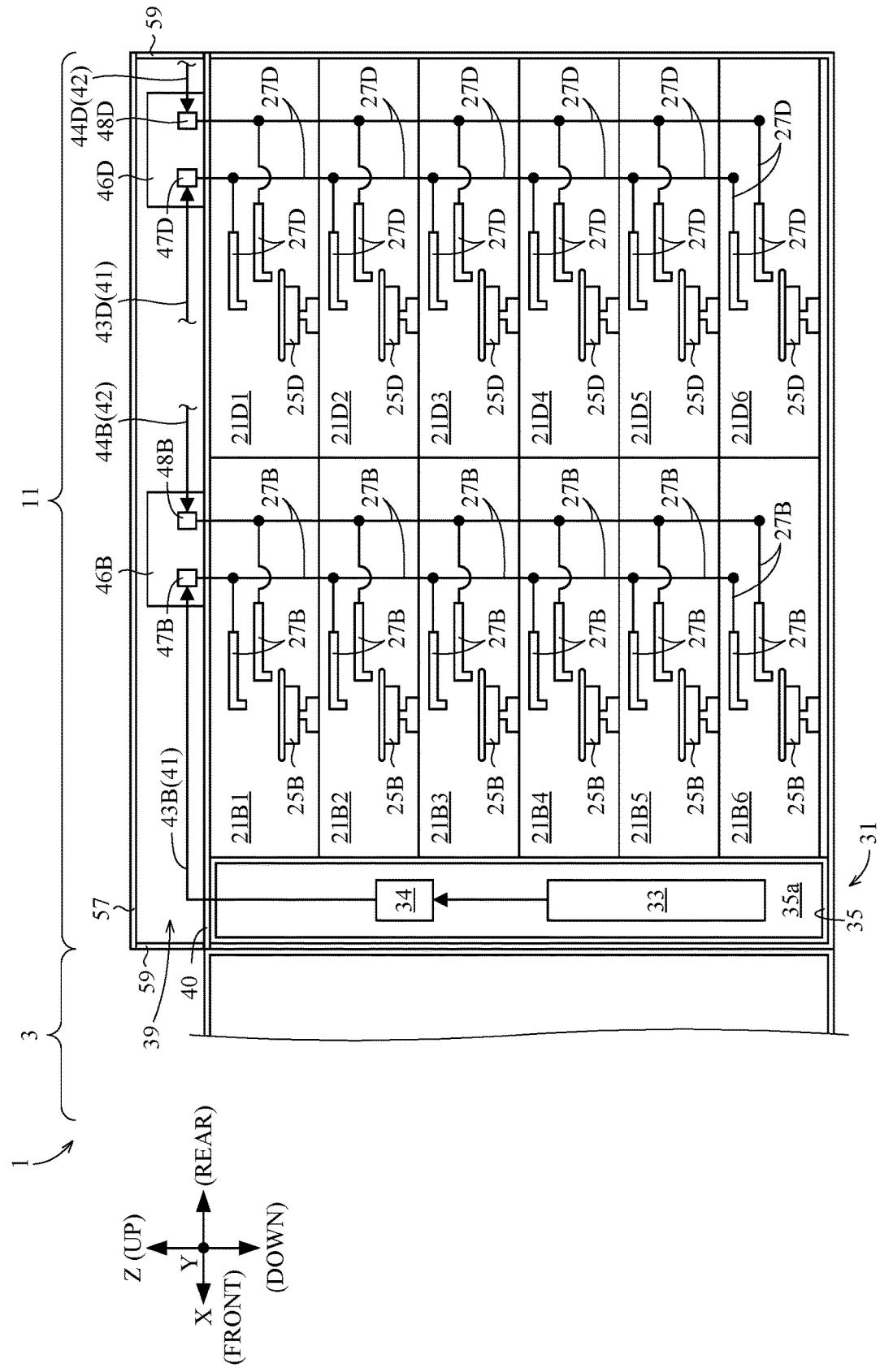
FIG. 5 is a left side view of a left part of the substrate treating apparatus.

FIG. 5 is a left side view of a left part of the substrate treating apparatus 1. The treating block 11 includes five second treating units 21B2 to 21B6 in addition to the second treating unit 21B1. The second treating units 21B2 to 21B6 each have a configuration common to the configuration of the first treating unit 21A1.

The second treating units 21B1 to 21B6 align in line in the vertical direction Z. The second treating units 21B1 to 21B6 are stacked. The second treating units 21B4 to 21B6 are arranged below the second treating units 21B1 to 21B3.

Likewise, the treating block 11 includes five fourth treating units 21D2 to 21D6 in addition to the fourth treating unit 21D1. The fourth treating units 21D2 to 21D6 each have a configuration common to the configuration of the first treating unit 21A1.

The fourth treating units 21D1 to 21D6 align in line in the vertical direction Z. The fourth treating units 21D1 to 21D6 are stacked. The fourth treating units 21D4 to 21D6 are arranged below the fourth treating units 21D1 to 21D3.

The transport mechanism 13A transports the substrates W to the second treating units 21B1 to 21B3, the third treating units 21C1 to 21C3, and the fourth treating units 21D1 to 21D3. The transport mechanism 13B transports the substrates W to the second treating units 21B4 to 21B6, the third treating units 21C4 to 21C6, and the fourth treating units 21D4 to 21D6.

When no distinction is made among the first treating units 21A1 to 21A6, they are each referred to as a first treating unit 21A. When no distinction is made among the second treating units 21B1 to 21B6, they are each referred to as a second treating unit 21B. When no distinction is made among the third treating units 21C1 to 21C6, they are each referred to as a third treating unit 21C. When no distinction is made among the fourth treating units 21D1 to 21D6, they are each referred to as a fourth treating unit 21D. When no distinction is made hereinunder between the transportation spaces 12A and 12B, they are each referred to as a transportation space 12.

The first liquid reservoir 31 includes a first tank 33 and a first pump 34. The first tank 33 is a container where a treatment liquid is stored. The first tank 33 stores a treatment liquid (specifically, first treatment liquid). The first pump 34 is in communication with the first tank 33. The first pump 34 is connected to the first tank 33, for example. The first pump 34 feeds while pressing the treatment liquid.

The first liquid reservoir 31 includes a cabinet 35. The cabinet 35 defines an accommodation space 35a provided inside thereof. The first tank 33 and the first pump 34 are installed in the accommodation space 35a. The cabinet 35 separates the accommodation space 35a from the transportation space 12. The cabinet 35 separates the accommodation space 35a from the second treating unit 21B.

Reference is made to FIG. 4. The second liquid reservoir 32 includes a second tank 36 and a second pump 37. The second tank 36 is a container where a treatment liquid is stored. The second tank 36 stores a treatment liquid (specifically, second treatment liquid). The second pump 37 is in communication with the second tank 36. The second pump 37 is connected to the second tank 36, for example. The second pump 37 feeds the treatment liquid under pressure.

The second liquid reservoir 32 includes a cabinet 38. The cabinet 38 defines an accommodation space 38a provided inside thereof. The second tank 36 and the second pump 37 are installed in the accommodation space 38a. The cabinet 38 separates the accommodation space 38a from the transportation space 12. The cabinet 38 separates the accommodation space 38a from the third treating unit 21C.

Reference is made to FIGS. 2 to 5. The substrate treating apparatus 1 includes an upper space 39. The upper space 39 is formed above the transportation space 12, the first treating unit 21A, the second treating unit 21B, the third treating unit 21C, the fourth treating unit 21D, the first liquid reservoir 31, and the second liquid reservoir 32.

The substrate treating apparatus 1 further includes a partition 40. The partition 40 has a horizontal plate shape. The partition 40 is located above the transportation space 12, the first to fourth treating units 21A to 21D, the first liquid reservoir 31, and the second liquid reservoir 32. The partition 40 is located below the upper space 39. The partition 40 separates the upper space 39 from the transportation space 12. Likewise, the partition 40 separates the upper space 39 from the first to fourth treating units 21A to 21D. The partition 40 separates the upper space 39 from the first and second liquid reservoirs 31 and 32.

Figure 6:
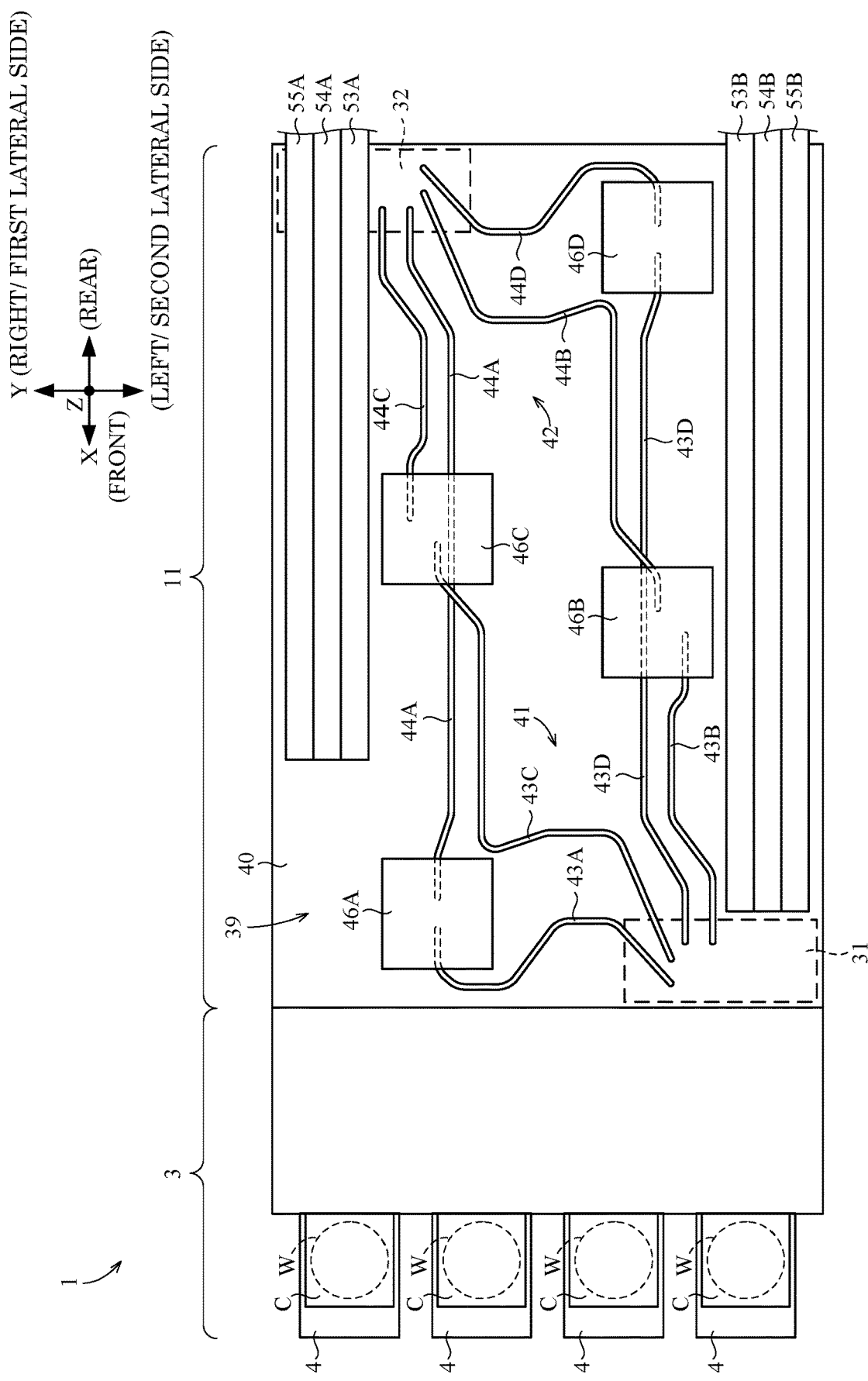
FIG. 6 is a plan view of the substrate treating apparatus.

Reference is now made to FIGS. 4 to 6. FIG. 6 is a plan view of the substrate treating apparatus 1. FIG. 6 shows the upper space 39. The substrate treating apparatus 1 includes a first distributing portion 41. The first distributing portion 41 is provided in the upper space 39. The first distributing portion 41 distributes the treatment liquid from the first liquid reservoir 31 to the first treating unit 21A, the second treating unit 21B, the third treating unit 21C, and the fourth treating unit 21D.

The first distributing portion 41 extends substantially horizontally. The first distributing portion 41 extends rearward from the first liquid reservoir 31.

Specifically, the first distributing portion 41 is in communication with the first pump 34. For example, the first distributing portion 41 is connected to the first pump 34. The first distributing portion 41 is in communication with the first liquid supplying unit 27A, the second liquid supplying unit 27B, the third liquid supplying unit 27C, and the fourth liquid supplying unit 27D. For example, the first distributing portion 41 is connected to the first liquid supplying unit 27A, the second liquid supplying unit 27B, the third liquid supplying unit 27C, and the fourth liquid supplying unit 27D.

The substrate treating apparatus 1 includes a second distributing portion 42. The second distributing portion 42 is provided in the upper space 39. The second distributing portion 42 distributes the treatment liquid from the second liquid reservoir 32 to the first treating unit 21A, the second treating unit 21B, the third treating unit 21C, and the fourth treating unit 21D.

The second distributing portion 42 extends substantially horizontally. The second distributing portion 42 extends forward from the second liquid reservoir 32.

Specifically, the second distributing portion 42 is in communication with the second pump 37. For example, the second distributing portion 42 is connected to the second pump 37. The second distributing portion 42 is in communication with the first liquid supplying unit 27A, the second liquid supplying unit 27B, the third liquid supplying unit 27C, and the fourth liquid supplying unit 27D. For example, the second distributing portion 42 is connected to the first liquid supplying unit 27A, the second liquid supplying unit 27B, the third liquid supplying unit 27C, and the fourth liquid supplying unit 27D.

Reference is made to FIG. 6. The second distributing portion 42 has a configuration equal to a configuration in which the first distributing portion 41 is rotated by 180 degrees in plan view. In other words, the second distributing portion 42 has a configuration equal to the configuration in which the first distributing portion 41 is rotated by 180 degrees about the vertical axis.

Specifically, the first distributing portion 41 includes a first pipe 43A, a second pipe 43B, a third pipe 43C, and a fourth pipe 43D. The first pipe 43A communicates the first liquid reservoir 31 with the first treating unit 21A (first liquid supplying unit 27A). The first pipe 43A connects the first liquid reservoir 31 to the first treating unit 21A (first liquid supplying unit 27A). The second pipe 43B communicates the first liquid reservoir 31 with the second treating unit 21B (second liquid supplying unit 27B). The second pipe 43B connects the first liquid reservoir 31 to the second treating unit 21B (second liquid supplying unit 27B). The third pipe 43C communicates the first liquid reservoir 31 with the third treating unit 21C (third liquid supplying unit 27C). The third pipe 43C connects the first liquid reservoir 31 to the third treating unit 21C (third liquid supplying unit 27C). The fourth pipe 43D communicates the first liquid reservoir 31 with the fourth treating unit 21D (fourth liquid supplying unit 27D). The fourth pipe 43D connects the first liquid reservoir 31 to the fourth treating unit 21D (fourth liquid supplying unit 27D).

The second distributing portion 42 includes a fifth pipe 44A, a sixth pipe 44B, a seventh pipe 44C, and an eighth pipe 44D. The fifth pipe 44A communicates the second liquid reservoir 32 with the first treating unit 21A (first liquid supplying unit 27A). The fifth pipe 44A connects the second liquid reservoir 32 to the first treating unit 21A (first liquid supplying unit 27A). The sixth pipe 44B communicates the second liquid reservoir 32 with the second treating unit 21B (second liquid supplying unit 27B). The sixth pipe 44B connects the second liquid reservoir 32 to the second treating unit 21B (second liquid supplying unit 27B). The seventh pipe 44C communicates the second liquid reservoir 32 with the third treating unit 21C (third liquid supplying unit 27C). The seventh pipe 44C connects the second liquid reservoir 32 to the third treating unit 21C (third liquid supplying unit 27C). The eighth pipe 44D communicates the second liquid reservoir 32 with the fourth treating unit 21D (fourth liquid supplying unit 27D). The eighth pipe 44D connects the second liquid reservoir 32 to the fourth treating unit 21D (fourth liquid supplying unit 27D).

Here, the eighth pipe 44D has a configuration equal to a configuration in which the first pipe 43A is rotated by 180 degrees in plan view. In other words, the eighth pipe 44D has a shape equal to a shape obtained by rotating the first pipe 43A by 180 degrees about the vertical axis. The seventh pipe 44C has a configuration equal to a configuration in which the second pipe 43B is rotated by 180 degrees in plan view. The sixth pipe 44B has a configuration equal to a configuration in which the third pipe 43C is rotated by 180 degrees in plan view. The fifth pipe 44A has a configuration equal to a configuration in which the fourth pipe 43D is rotated by 180 degrees in plan view.

The length of the first pipe 43A in the transverse direction Y is larger than the length of the second pipe 43B in the transverse direction Y. On the other hand, the length of the first pipe 43A in the front-back direction X is smaller than the length of the second pipe 43B in the front-back direction X. Accordingly, a difference in length between the first pipe 43A and the second pipe 43B is relatively small.

The length of the third pipe 43C in the transverse direction Y is larger than the length of the fourth pipe 43D in the transverse direction Y. On the other hand, the length of the third pipe 43C in the front-back direction X is smaller than the length of the fourth pipe 43D in the front-back direction X. Accordingly, a difference in length between the third pipe 43C and the fourth pipe 43D is relatively small.

The length of the fifth pipe 44A in the transverse direction Y is smaller than the length of the sixth pipe 44B in the transverse direction Y. On the other hand, the length of the fifth pipe 44A in the front-back direction X is larger than the length of the sixth pipe 44B in the front-back direction X. Accordingly, a difference in length between the fifth pipe 44A and the sixth pipe 44B is relatively small.

The length of the seventh pipe 44C in the transverse direction Y is smaller than the length of the eighth pipe 44D in the transverse direction Y. On the other hand, the length of the seventh pipe 44C in the front-back direction X is larger than the length of the eighth pipe 44D in the front-back direction X. Accordingly, a difference in length between the seventh pipe 44C and the eighth pipe 44D is relatively small.

The substrate treating apparatus 1 includes a first connecting box 46A, a second connecting box 46B, a third connecting box 46C, and a fourth connecting box 46D. The first connecting box 46A, the third connecting box 46C, and the second liquid reservoir 32 align in this order in the front-back direction X. The first liquid reservoir 31, the second connecting box 46B, and the fourth connecting box 46D align in this order in the front-back direction X. The first connecting box 46A and the first liquid reservoir 31 align in the transverse direction Y. The second connecting box 46B and the third connecting box 46C align in the transverse direction Y. The fourth connecting box 46D and the second liquid reservoir 32 align in the transverse direction Y.

The first distributing portion 41 extends from the first liquid reservoir 31 to the first connecting box 46A, the second connecting box 46B, the third connecting box 46C, and the fourth connecting box 46D. Specifically, the first pipe 43A extends from the first liquid reservoir 31 to the first connecting box 46A. The second pipe 43B extends from the first liquid reservoir 31 to the second connecting box 46B. The third pipe 43C extends from the first liquid reservoir 31 to the third connecting box 46C. The fourth pipe 43D extends from the first liquid reservoir 31 to the fourth connecting box 46D.

The second distributing portion 42 extends from the second liquid reservoir 32 to the first connecting box 46A, the second connecting box 46B, the third connecting box 46C, and the fourth connecting box 46D. Specifically, the fifth pipe 44A extends from the second liquid reservoir 32 to the first connecting box 46A. The sixth pipe 44B extends from the second liquid reservoir 32 to the second connecting box 46B. The seventh pipe 44C extends from the second liquid reservoir 32 to the third connecting box 46C. The eighth pipe 44D extends from the second liquid reservoir 32 to the fourth connecting box 46D.

Reference is made to FIG. 4. The first connecting box 46A and the third connecting box 46C are each arranged in the upper space 39. The first connecting box 46A and the third connecting box 46C are arranged at substantially the same height position.

The first connecting box 46A is located above the first treating unit 21A. The first connecting box 46A is located more forward than the first holder 25A in the front-back direction X.

The third connecting box 46C is located above the third treating unit 21C. The third connecting box 46C is located more forward than the third holder 25C in the front-back direction X.

Reference is made to FIG. 5. The second connecting box 46B and the fourth connecting box 46D are each arranged in the upper space 39. The second connecting box 46B and the fourth connecting box 46D are arranged at substantially the same height position.

The second connecting box 46B is located above the second treating unit 21B. The second connecting box 46B is located more rearward than the second holder 25B in the front-back direction X.

The fourth connecting box 46D is located above the fourth treating unit 21D. The fourth connecting box 46D is located more rearward than the fourth holder 25D in the front-back direction X.

Reference is made to FIG. 3. The first connecting box 46A and the second connecting box 46B are arranged at substantially the same height position. Consequently, the first to fourth connecting boxes 46A to 46D are arranged at substantially the same height position.

Reference is made to FIG. 4. The first distributing portion 41 and the second distributing portion 42 are each in communication with the first liquid supplying unit 27A. The first distributing portion 41 and the second distributing portion 42 are each connected to the first liquid supplying unit 27A in the first connecting box 46A. The first distributing portion 41 and the second distributing portion 42 are each in communication with the third liquid supplying unit 27C. The first distributing portion 41 and the second distributing portion 42 are each connected to the third liquid supplying unit 27C in the third connecting box 46C.

The substrate treating apparatus 1 includes a first joint 47A and a fifth joint 48A. The first joint 47A is accommodated in the first connecting box 46A. The first joint 47A connects the first distributing portion 41 (specifically, first pipe 43A) to the first liquid supplying unit 27A. The fifth joint 48A is accommodated in the first connecting box 46A. The fifth joint 48A connects the second distributing portion 42 (specifically, fifth pipe 44A) to the first liquid supplying unit 27A.

The substrate treating apparatus 1 includes a third joint 47C and a seventh joint 48C. The third joint 47C is accommodated in the third connecting box 46C. The third joint 47C connects the first distributing portion 41 (specifically, third pipe 43C) to the third liquid supplying unit 27C. The seventh joint 48C is accommodated in the third connecting box 46C. The seventh joint 48C connects the second distributing portion 42 (specifically, seventh pipe 44C) to the third liquid supplying unit 27C.

Reference is made to FIG. 5. The first distributing portion 41 and the second distributing portion 42 are each in communication with the second liquid supplying unit 27B. The first distributing portion 41 and the second distributing portion 42 are each connected to the second liquid supplying unit 27B in the second connecting box 46B. The first distributing portion 41 and the second distributing portion 42 are each in communication with the fourth liquid supplying unit 27D. The first distributing portion 41 and the second distributing portion 42 are each connected to the fourth liquid supplying unit 27D in the fourth connecting box 46D.

The substrate treating apparatus 1 includes a second joint 47B and a sixth joint 48B. The second joint 47B is accommodated in the second connecting box 46B. The second joint 47B connects the first distributing portion 41 (specifically, second pipe 43B) to the second liquid supplying unit 27B. The sixth joint 48B is accommodated in the second connecting box 46B. The sixth joint 48B connects the second distributing portion 42 (specifically, sixth pipe 44B) to the second liquid supplying unit 27B.

The substrate treating apparatus 1 includes a fourth joint 47D and an eighth joint 48D. The fourth joint 47D is accommodated in the fourth connecting box 46D. The fourth joint 47D connects the first distributing portion 41 (specifically, fourth pipe 43D) to the fourth liquid supplying unit 27D. The eighth joint 48D is accommodated in the fourth connecting box 46D. The eighth joint 48D connects the second distributing portion 42 (specifically, eighth pipe 44D) to the fourth liquid supplying unit 27D.

Reference is made to FIGS. 3 and 6. The substrate treating apparatus 1 further includes exhaust pipes 53A, 53B, 54A, 54B, 55A, and 55B. The exhaust pipes 53A, 53B, 54A, 54B, 55A, and 55B are each arranged in the upper space 39. The exhaust pipes 53A, 54A, and 55A exhaust gas in the first treating unit 21A and the third treating unit 21C. The exhaust pipes 53B, 54B, and 55B exhaust gas in the second treating unit 21B and the fourth treating unit 21D.

The exhaust pipes 53A, 54A, and 55A are arranged more rightward than the first distributing portion 41 and the second distributing portion 42. The exhaust pipes 53A, 54A, and 55A are arranged more rightward than the first to fourth connecting boxes 46A to 46D. The exhaust pipes 53B, 54B, and 55B are arranged more leftward than the first distributing portion 41 and the second distributing portion 42. The exhaust pipes 53B, 54B, and 55B are arranged more leftward than the first to fourth connecting boxes 46A to 46D.

The exhaust pipes 53A, 54A, and 55A are arranged at substantially the same height position. The exhaust pipes 53B, 54B, and 55B are arranged at substantially the same height position. The exhaust pipes 53B, 54B, and 55B are arranged at substantially the same height position as the exhaust pipes 53A, 54A, and 55A. The exhaust pipes 53A, 53B, 54A, 54B, 55A, and 55B are arranged at substantially the same height position as the first to fourth connecting boxes 46A to 46D.

Reference is made to FIGS. 2 to 5. The substrate treating apparatus 1 further includes a foot board 57. The foot board 57 is installed in the upper space 39. The foot board 57 is of a substantially flat plate shape. Here in FIG. 6, the illustration of the foot board 57 is omitted.

The foot board 57 allows a user to get thereon. The foot board 57 is securely supported on the treating block 11. The foot board 57 is securely supported on a frame 59 of the treating block 11, for example. The foot board 57 has sufficient rigidity. The foot board 57 has a sufficient strength. The foot board 57 is harder to bend than the partition 40.

Figure 7:
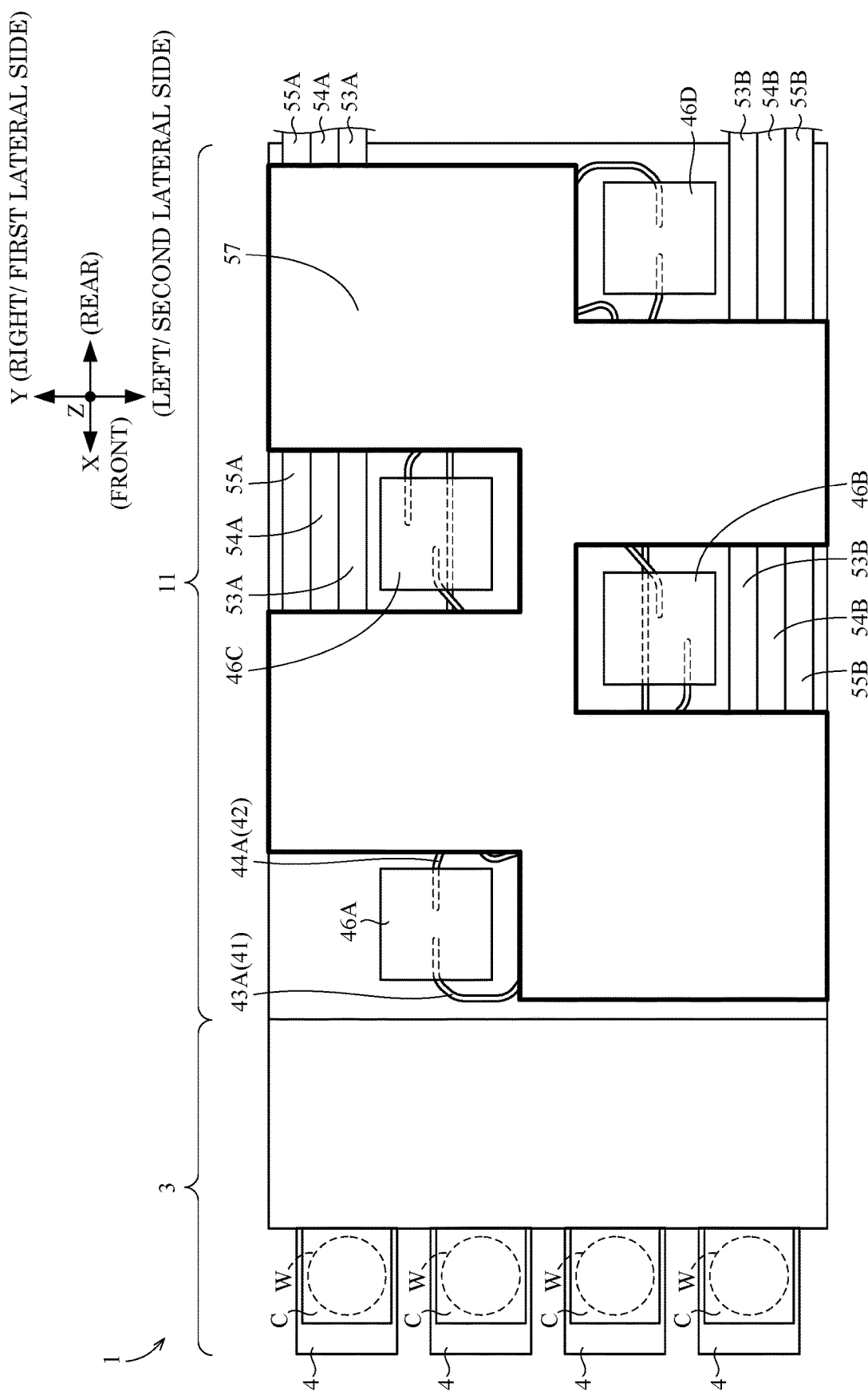
FIG. 7 is a plan view of the substrate treating apparatus.

FIG. 7 is a plan view of the substrate treating apparatus 1. The foot board 57 is located above at least part of the first distributing portion 41. The foot board 57 protects the first distributing portion 41 from damages. The foot board 57 is located above at least part of the second distributing portion 42. The foot board 57 protects the second distributing portion 42 from damages.

The foot board 57 is located above at least part of the exhaust pipes 53A, 54A, and 55A. The foot board 57 protects the exhaust pipes 53A, 54A, and 55A from damages. The foot board 57 is located above at least part of the exhaust pipes 53B, 54B, and 55B. The foot board 57 protects the exhaust pipes 53B, 54B, and 55B from damages.

The foot board 57 is located in the vicinity of the first connecting box 46A, the second connecting box 46B, the third connecting box 46C, and the fourth connecting box 46D.

The first foot board 57 extends from the first connecting box 46A to the fourth connecting box 46D while passing between the second connecting box 46B and the third connecting box 46C. The foot board 57 extends in the front-back direction X.

3. Configuration of Treating Unit 21

When no distinction is made hereinunder among the first to fourth treating units 21A to 21D, they are each referred to as a treating unit 21. When no distinction is made among the first to fourth holders 25A to 25D, they are each referred to as a holder 25. When no distinction is made among the first to fourth liquid supplying units 27A to 27D, they are each referred to as a liquid supplying unit 27. When no distinction is made among the first to fourth connecting boxes 46A to 46D, they are each referred to as a connecting box 46. When no distinction is made among the first to fourth joints 47A to 47D, they are each referred to as a joint 47. When no distinction is made among the fifth to eighth joints 48A to 48D, they are each referred to as a joint 48. When no distinction is made between the exhaust pipes 53A and 53B, they are each referred to as an exhaust pipe 53. When no distinction is made between the exhaust pipes 54A and 54B, they are each referred to as an exhaust pipe 54. When no distinction is made between the exhaust pipes 55A and 55B, they are each referred to as an exhaust pipe 55.

Figure 8:
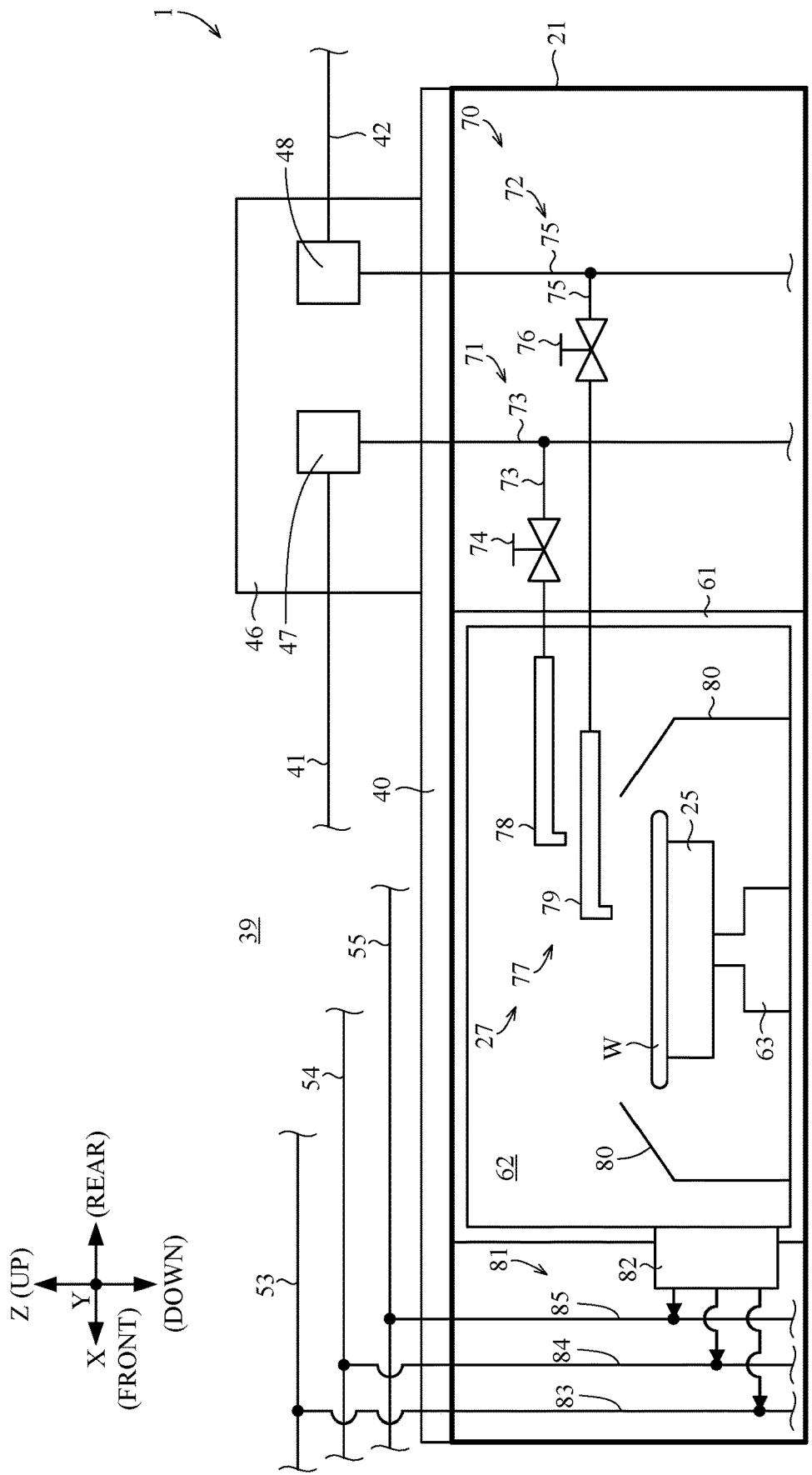
FIG. 8 is a side view of a treating unit.

FIG. 8 is a side view of the treating unit 21. As described above, the treating unit 21 includes the holder 25 and the liquid supplying unit 27.

The treating unit 21 further includes a treatment housing 61. The treatment housing 61 is located adjacent to the transportation space 12. The treatment housing 61 is of a box shape, for example. The treatment housing 61 defines a treating space 62 provided inside thereof. The treatment housing 61 accommodates the holder 25. The holder 25 is provided inside of the treatment housing 61.

The holder 25 holds one substrate W in a horizontal posture.

The treating unit 21 includes a rotation driving unit 63. The rotation driving unit 63 is located inside of the treatment housing 61. The rotation driving unit 63 is coupled to the holder 25. For example, the first holder 25A is configured to rotate around the center point 26A. The second holder 25B is configured to rotate around the center point 26B. The third holder 25C is configured to rotate around the center point 26C. The fourth holder 25D is configured to rotate around the center point 26D. The rotation driving unit 63 rotates the holder 25. The substrate W held by the holder 25 rotates integrally with the holder 25.

The liquid supplying unit 27 includes a dispensing adjusting unit 70 and a dispensing unit 77. The dispensing adjusting unit 70 is in communication with the first distributing portion 41 and the second distributing portion 42. The dispensing adjusting unit 70 is connected to the first distributing portion 41 and the second distributing portion 42, for example. The dispensing adjusting unit 70 is located inside of the treatment housing 61. The dispensing unit 77 is located outside of the treatment housing 61. The dispensing unit 77 is in communication with the dispensing adjusting unit 70. The dispensing unit 77 is connected to the dispensing adjusting unit 70, for example. The dispensing unit 77 dispenses a treatment liquid to the substrate W held by the holder 25. The dispensing adjusting unit 70 supplies and stops supplying the treatment liquid to the dispensing unit 77.

Specifically, the dispensing adjusting unit 70 includes a first dispensing adjusting portion 71 and a second dispensing adjusting portion 72. The first dispensing adjusting portion 71 is in communication with the first distributing portion 41. The first dispensing adjusting portion 71 is connected to the first distributing portion 41, for example. The second dispensing adjusting portion 72 is in communication with the second distributing portion 42. The second dispensing adjusting portion 72 is connected to the second distributing portion 42, for example.

The first dispensing adjusting portion 71 includes a pipe 73 and a valve 74. The pipe 73 extends to the connecting box 46. The pipe 73 is in communication with the first distributing portion 41 via the joint 47. The pipe 73 is connected to the first distributing portion 41 via the joint 47, for example. The valve 74 is provided on the pipe 73. Likewise, the second dispensing adjusting portion 72 includes a pipe 75 and a valve 76. The pipe 75 extends to the connecting box 46. The pipe 75 is in communication with the second distributing portion 42 via the joint 48. The pipe 75 is connected to the second distributing portion 42 via the joint 48, for example. The valve 76 is provided on the pipe 75.

The dispensing unit 77 includes a first nozzle 78 and a second nozzle 79. The first nozzle 78 is in communication with the first dispensing adjusting portion 71 (specifically, pipe 73). The first nozzle 78 is connected to the first dispensing adjusting portion 71 (specifically, pipe 73), for example. The second nozzle 79 is in communication with the second dispensing adjusting portion 72 (specifically, pipe 75). The second nozzle 79 is connected to the second dispensing adjusting portion 72 (specifically, pipe 75), for example. The first nozzle 78 dispenses a treatment liquid (specifically, first treatment liquid). The second nozzle 79 dispenses a treatment liquid (specifically, second treatment liquid).

Here, the liquid supplying unit 27 includes no tank for storing the treatment liquids. The liquid supplying unit 27 includes no pump for feeding while pressing the treatment liquids.

The treating unit 21 includes a cup 80. The cup 80 is provided inside of the treatment housing 61. The cup 80 is of a substantially cylindrical shape. The cup 80 is located around the holder 25. The cup 80 receives the treatment liquid scattered from the substrate W held by the holder 25.

The treating unit 21 includes a gas exhausting unit 81. The gas exhausting unit 81 exhausts gas inside of the treatment housing 61. At least part of the gas exhausting unit 81 is located outside of the treatment housing 61.

The gas exhausting unit 81 includes a switching mechanism 82 and a plurality of (e.g., three) exhaust pipes 83, 84, and 85. The switching mechanism 82 is connected to the treatment housing 61. The exhaust pipes 83 to 85 are each connected to the switching mechanism 82. The pipe 83 is connected to the exhaust pipe 53. The pipe 84 is connected to the exhaust pipe 54. The pipe 85 is connected to the exhaust pipe 55. The switching mechanism 82 brings the treatment housing 61 to be in communication with one of the exhaust pipes 83 to 85. The switching mechanism 82 switches an exhaust channel for the treatment housing 61 among the exhaust pipes 83 to 85. Specifically, the switching mechanism 82 performs switch among a first condition, a second condition, and a third condition. In the first condition, the switching mechanism 82 causes the treatment housing 61 to be in communication with the exhaust pipe 83 and to be blocked from the exhaust pipes 84 and 85. In the first condition, only the exhaust pipe 83 exhausts gas from the treatment housing 61. That is, in the first condition, both exhaust pipe 84 and the exhaust pipe 85 exhaust no gas from the treatment housing 61. In the second condition, the switching mechanism 82 causes the treatment housing 61 to be in communication with the exhaust pipe 84 and to be blocked from the exhaust pipes 83 and 85. In the second condition, only the exhaust pipe 84 exhausts gas from the treatment housing 61. In the third condition, the switching mechanism 82 causes the treatment housing 61 to be in communication with the exhaust pipe 85 and to be blocked from the exhaust pipes 83 and 84. In the third condition, only the exhaust pipe 85 exhausts gas from the treatment housing 61.

4. Exemplary Operation of Substrate Treating Apparatus 1

The following simply describes one example of operation of the substrate treating apparatus 1. When no distinction is made hereinunder between the transportation spaces 12A and 12B, they are each referred to as a transportation space 12. When no distinction is made between the transport mechanisms 13A and 13B, they are each referred to as a transport mechanism 13. When no distinction is made between the substrate platforms 16A and 16B, they are each referred to as a substrate platform 16. When no distinction is made among the first to fourth transportation ports 28A to 28D, they are each referred to as a transportation port 28.

The indexer 3 supplies a substrate W to the treating block 11. Specifically, the transport mechanism 6 transports the substrate W from the carrier C to the substrate platform 16. For example, the transport mechanism 6 transports substrates W to the substrate platforms 16A and 16B alternately, for example.

The transport mechanism 13 receives a substrate W from the indexer 3 via the substrate platform 16. Then, the transport mechanism 13 transports the substrate W from the substrate platform 16 to one treating unit 21. Specifically, the transport mechanism 13 moves in parallel in the front-back direction X. Then, the transport mechanism 13 stops at a position opposite to the holder 25. The transport mechanism 13 delivers the substrate W to the holder 25 through the transportation port 28.

The treatment liquid (first treatment liquid) is distributed from the first liquid reservoir 31 to the treating unit 21 (liquid supplying unit 27) through the first distributing portion 41. The treatment liquid (second treatment liquid) is distributed from the second liquid reservoir 32 to the treating unit 21 (liquid supplying unit 27) through the second distributing portion 42.

The treating unit 21 treats the substrate W. Specifically, the holder 25 holds the substrate W. The rotation driving unit 63 rotates the substrate W held by the holder 25. The liquid supplying unit 27 supplies a treatment liquid to the substrate W held by the holder 25. The cup 80 receives the treatment liquid scattered from the substrate W. The gas exhausting unit 81 exhausts gas within the treating space 62.

The first dispensing adjusting portion 71 supplies the first treatment liquid to the first nozzle 78, for example. The first nozzle 78 dispenses the first treatment liquid to the substrate W. The switching mechanism 82 switches the exhaust channel of the treatment housing 61 to the exhaust pipe 83. The gas flows from the treatment housing 61 through the exhaust pipe 83 to the exhaust pipe 53. Thereafter, the first dispensing adjusting portion 71 stops supplying the first treatment liquid to the first nozzle 78. The first nozzle 78 stops dispensing the first treatment liquid.

Subsequently, the second dispensing adjusting portion 72 supplies the second treatment liquid to the second nozzle 79. The second nozzle 79 dispenses the second treatment liquid to the substrate W. The switching mechanism 82 switches the exhaust channel of the treatment housing 61 to the exhaust pipe 84. The gas flows from the treatment housing 61 through the exhaust pipe 84 to the exhaust pipe 54. Thereafter, the second dispensing adjusting portion 72 stops supplying the second treatment liquid to the second nozzle 79. The second nozzle 79 stops dispensing the second treatment liquid.

After the treating unit 21 performs treatment on the substrate W, the treating block 11 returns the treated substrate W to the indexer 3. Specifically, the transport mechanism 13 transports the substrate W from the treating unit 21 (holder 25) to the substrate platform 16.

The indexer 3 collects the substrate W from the treating block 11. Specifically, the transport mechanism 6 transports the substrate W from the substrate platform 16 to the carrier C.

5. Effect of the Embodiment

The substrate treating apparatus 1 includes the indexer 3, and the treating block 11. The treating block 11 is located behind the indexer 3. The treating block 11 is connected to the indexer 3. The treating block 11 includes the transportation space 12A, the transport mechanism 13A, the first treating unit 21A1, and the second treating unit 21B1. The transportation space 12A extends in the front-back direction X. The transport mechanism 13A is located in the transportation space 12A. The transport mechanism 13A transports substrates W. The first treating unit 21A1 treats the substrates W. The second treating unit 21B1 treats the substrates W. The first treating unit 21A1 includes the first holder 25A and the first liquid supplying unit 27A. The first holder 25A holds a substrate W. The first liquid supplying unit 27A supplies a treatment liquid to the substrate W held by the first holder 25A. The second treating unit 21B1 includes the second holder 25B and the second liquid supplying unit 27B. The second holder 25B holds a substrate W. The second liquid supplying unit 27B supplies a treatment liquid to the substrate W held by the second holder 25B.

Here, the first treating unit 21A1 is located rightward of the transportation space 12A. The first holder 25A has the center point 26A positioned more rearward than the middle point 24A of the first treating unit 21A1 in plan view. The second treating unit 21B1 is located leftward of the transportation space 12A. The second holder 25B has the center point 26B positioned more forward than the middle point 24B of the second treating unit 21B1 in plan view. This can achieve commonality in configurations of the first treating unit 21A1 and the second treating unit 21B1 easily. Two treating units having the same configuration may be adopted as the first treating unit 21A1 and the second treating unit 21B1. This can easily suppress uneven quality of treatment on substrates W between the first treating unit 21A1 and the second treating unit 21B1. That is, uniformized quality of treatment on substrates W is obtained easily between the first treating unit 21A1 and the second treating unit 21B1. Moreover, commonality in components of the first treating unit 21A1 and the second treating unit 21B1 is obtained easily.

The transport mechanism 13A transports substrates W to the first holder 25A and the second holder 25B. The transport mechanism 13A is configured to be movable in parallel in the front-back direction X. This causes the transport mechanism 13A to transport substrates W to the first holder 25A and the second holder 25B suitably.

The second treating unit 21B1 has the front end 22B located rearward than the front end 22A of the first treating unit 21A1. That is, the second treating unit 21B1 is shifted rearward relative to the first treating unit 21A1. The second treating unit 21B1 has the front end 22B located more forward than the rear end 23A of the first treating unit 21A1. Accordingly, the second holder 25B is not located extremely rearward. The distance between the first holder 25A and the second holder 25B in the front-back direction X is not excessively large. This can suitably reduce the moving distance of the transport mechanism 13A in the front-back direction X. Specifically, the distance L is relatively small.

Figure 10:
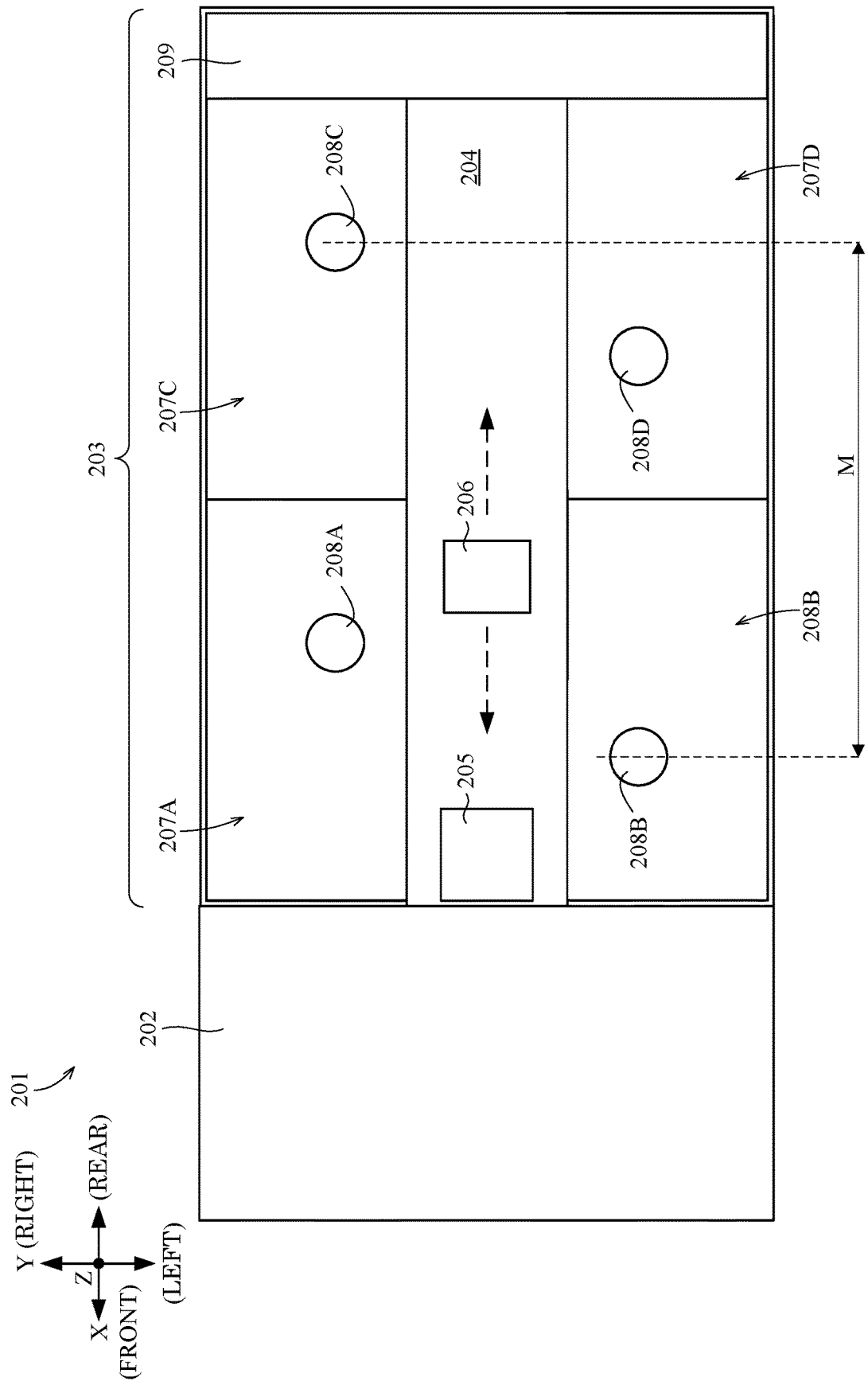
FIG. 10 is a plan view of a substrate treating apparatus according to a comparative example.

Reference is made to FIGS. 1 and 10. FIG. 10 is the plan view of a substrate treating apparatus 201 according to a comparative example. FIG. 10 shows the distance M. The distance M is a distance between the holders 208B and 208C in the front-back direction X. The distance L in the substrate treating apparatus 1 is smaller than the distance M in the substrate treating apparatus 201. The distance between the first holder 25A and the second holder 25B in the front-back direction X is smaller than a distance between the holder 208A and the holder 208B in the front-back direction X. Consequently, the transport mechanism 13A can transport substrates W to the first holder 25A and the second holder 25B efficiently. As a result, the first treating unit 21A1 and the second treating unit 21B1 can each treat a substrate W efficiently. This achieves suitably enhanced throughput of the substrate treating apparatus 1.

The treating block 11 has the first liquid reservoir 31. The first liquid reservoir 31 stores a treatment liquid to be distributed to the first treating unit 21A1 and the second treating unit 21B1. The first liquid reservoir 31 is located leftward of the transportation space 12A. The first liquid reservoir 31 is located adjacent to and in front of the second treating unit 21B1. In such a manner as above, a space in front of the second treating unit 21B1 is put to effective use. This achieves suitable suppression of increase in length of the substrate treating apparatus 1 in the front-back direction X. Footprint of the substrate treating apparatus 1 does not increase excessively.

As described above, the substrate treating apparatus 1 according to the embodiment can achieve commonality in configurations of the first treating unit 21A1 and the second treating unit 21B1 easily. As a result, treatment quality in both the first treating unit 21A1 and the second treating unit 21B1 can easily be uniformized. Moreover, the transport mechanism 13A can transport substrates W to the first treating unit 21A1 and the second treating unit 21B1 efficiently. This results in suitably enhanced throughput of the substrate treating apparatus 1. Moreover, this results in suitable suppression of increase in footprint of the substrate treating apparatus 1.

The center point 26B of the second holder 25B is located more forward than the center point 26A of the first holder 25A. Accordingly, the second treating unit 21B1 is not shifted excessively rearward relative to the first treating unit 21A1. This achieves suitable suppression of increase in length of the substrate treating apparatus 1 in the front-back direction X.

The first liquid reservoir 31 has the front end 31f. The front end 31f is located at substantially the same position as the front end 22A of the first treating unit 21A1 in the front-back direction X. This achieves suitable suppression of increase in length of the substrate treating apparatus 1 in the front-back direction X.

The first treating unit 21A1 is located adjacent to and behind the indexer 3. The first liquid reservoir 31 is located adjacent to and behind the indexer 3. This achieves suitable suppression of increase in length of the treating block 11 in the front-back direction X.

The second treating unit 21B1 has the configuration equal to the configuration in which the first treating unit 21A1 is rotated by 180 degrees about a vertical axis. Consequently, treatment quality in both the first treating unit 21A1 and the second treating unit 21B1 can easily be uniformized.

The substrate treating apparatus 1 includes a substrate platform 16A. The substrate platform 16A places thereon a substrate W transported between the indexer 3 and the transport mechanism 13A. Consequently, the transport mechanism 13A can receive a substrate W from the indexer 3 easily. The transport mechanism 13A can send a substrate W to the indexer 3 easily.

At least part of the substrate platform 16A is located in the transportation space 12A. Accordingly, a movable range of the transport mechanism 13A is limited to the rear of the substrate platform 16A. Even in this case, the transport mechanism 13A can transport a substrate W to the second holder 26B easily. Specifically, the transport mechanism 13A does not possibly interfere with the substrate platform 16A when the transport mechanism 13A transports the substrate W to the second holder 26B. This is because the second treating unit 21B1 is shifted rearward relative to the first treating unit 21A1.

The substrate platform 16A is located between the first treating unit 21A1 and the first liquid reservoir 31. In other words, the first treating unit 21A1, the substrate platform 16A, and the first liquid reservoir 31 are arranged in the transverse direction Y in this order. Consequently, the substrate platform 16A does not prevent the transport mechanism 13A from transporting a substrate W to the second holder 26B.

The substrate treating apparatus 1 includes the third treating unit 21C1 and the fourth treating unit 21D1. The third treating unit 21C1 is located adjacent to and behind the first treating unit 21A1. The third treating unit 21C1 treats a substrate W. The fourth treating unit 21D1 is located adjacent to and behind the second treating unit 21B1. The fourth treating unit 21D1 treats a substrate W. The third treating unit 21C1 includes the third holder 25C and the third liquid supplying unit 27C. The third holder 25C holds a substrate W. The third liquid supplying unit 27C supplies a treatment liquid to the substrate W held by the third holder 25C. The fourth treating unit 21D1 includes the fourth holder 25D and the fourth liquid supplying unit 27D. The fourth holder 25D holds a substrate W. The fourth liquid supplying unit 27D supplies a treatment liquid to the substrate W held by the fourth holder 25D. The transport mechanism 13A transports substrates W to the third holder 25C and the fourth holder 25D. The first liquid reservoir 31 stores a treatment liquid to be distributed to the third treating unit 21C1 and the fourth treating unit 21D1. Here, the first third treating unit 21C1 is located rightward of the transportation space 12A. The third treating unit 21C1 has the middle point 24C in plan view. The third holder 25C has the center point 26C in plan view. The center point 26C is positioned more rearward than the middle point 24C in plan view. The fourth treating unit 21D1 is located leftward of the transportation space 12A. The fourth treating unit 21D1 has the middle point 24D in plan view. The fourth holder 25D has the center point 26D in plan view. The center point 26D is positioned more forward than the middle point 24D in plan view. This can achieve commonality in configurations of the first treating unit 21A1 and the third treating unit 21C1 easily. This can achieve commonality in configurations of the first treating unit 21A1 and the fourth treating unit 21D1 easily. Four treating units having the same configuration may be adopted as the first to fourth treating units 21A1 to 21D1. This can easily suppress uneven quality of treatment on substrates W among the first to fourth treating units 21A1 to 21D1. Moreover, commonality in components of the first to fourth treating units 21A1 to 21D1 is obtained easily.

The fourth treating unit 21D1 has the front end 22D located more rearward than the front end 22C of the third treating unit 21C1. That is, the fourth treating unit 21D1 is shifted rearward relative to the third treating unit 21C1. The fourth treating unit 21D1 has the front end 22D located more forward than the rear end 23C of the third treating unit 21C1. Accordingly, the fourth holder 25D is not located extremely backward. The distance between the third holder 25C and the fourth holder 25D in the front-back direction X is not excessively large. Moreover, the third treating unit 21C1 is located adjacent to and behind the first treating unit 21A1. The fourth treating unit 21D1 is located adjacent to and behind the second treating unit 21B1. This can suitably reduce the moving distance of the transport mechanism 13A in the front-back direction X. Specifically, the distance L is shortened suitably. Consequently, the transport mechanism 13A can transport substrates W to the first to fourth holders 25A to 25D efficiently. As a result, the first to fourth treating units 21A1 to 21D1 can each treat a substrate W efficiently.

The third treating unit 21C1 has a configuration equal to the configuration of the first treating unit 21A1. The fourth treating unit 21D1 has a configuration equal to the configuration in which the first treating unit 21A1 is rotated by 180 degrees about a vertical axis. This easily achieves uniformized quality of treatment on substrates W among the first to fourth treating units 21A1 to 21D1 easily.

The substrate treating apparatus 1 includes the second liquid reservoir 32. The second liquid reservoir 32 stores a treatment liquid to be distributed to the first treating unit 21A1, the second treating unit 21B1, the third treating unit 21C1, and the fourth treating unit 21D1. The second liquid reservoir 32 is located rightward of the transportation space 12A. The second liquid reservoir 32 is located adjacent to and behind the third treating unit 21C1. In such a manner as above, a space behind the third treating unit 21C1 is put to effective use. This achieves suitable suppression of increase in length of the substrate treating apparatus 1 in the front-back direction X.

The rear end 32r of the second liquid reservoir 32 is located at substantially the same position as the rear end 23D of the fourth treating unit 21D1 in the front-back direction X. This achieves suitable suppression of increase in length of the substrate treating apparatus 1 in the front-back direction X.

The treatment liquid stored in the second liquid reservoir 32 is different in type from the treatment liquid stored in the first liquid reservoir 31. Consequently, the first to fourth treating units 21A1 to 21D1 can each supply two types of treatment liquids to a substrate W.

The substrate treating apparatus 1 includes the upper space 39, the first distributing portion 41, and the second distributing portion 42. The upper space 39 is formed above the transportation space 12A1, the first treating unit 21A1, the second treating unit 21B1, the third treating unit 21C1, the fourth treating unit 21D1, the first liquid reservoir 31, and the second liquid reservoir 32. The first distributing portion 41 distributes the treatment liquid from the first liquid reservoir 31 to the first treating unit 21A1, the second treating unit 21B1, the third treating unit 21C1, and the fourth treating unit 21D1. The second distributing portion 42 distributes the treatment liquid from the second liquid reservoir 32 to the first treating unit 21A1, the second treating unit 21B1, the third treating unit 21C1, and the fourth treating unit 21D1. Here, the first distributing portion 41 is provided in the upper space 39. The second distributing portion 42 is provided in the upper space 39. This achieves suitable suppression of increase in footprint of the substrate treating apparatus 1.

The second distributing portion 42 has a configuration equal to a configuration in which the first distributing portion 41 is rotated by 180 degrees in plan view. Consequently, a flow path length of the first distributing portion 41 and a flow path length of the second distributing portion 42 are uniformized easily.

The substrate treating apparatus 1 includes a first connecting box 46A, a second connecting box 46B, a third connecting box 46C, and a fourth connecting box 46D. The first connecting box 46A is located above the first treating unit 21A1. The second connecting box 46B is located above the second treating unit 21B1. The third connecting box 46C is located above the third treating unit 21C1. The fourth connecting box 46D is located above the fourth treating unit 21D1. The first distributing portion 41 extends from the first liquid reservoir 31 to the first connecting box 46A, the second connecting box 46B, the third connecting box 46C, and the fourth connecting box 46D. The second distributing portion 42 extends from the second liquid reservoir 32 to the first connecting box 46A, the second connecting box 46B, the third connecting box 46C, and the fourth connecting box 46D. In such a manner as above, the first distributing portion 41 and the second distributing portion 42 both extend to the first connecting box 46A. Likewise, the first distributing portion 41 and the second distributing portion 42 both extend to the second to fourth connecting boxes 46B to 46D. Consequently, the flow path length of the first distributing portion 41 and the flow path length of the second distributing portion 42 can be uniformized easily.

The first connecting box 46A is located more forward than the first holder 25A in the front-back direction X. The second connecting box 46B is located more rearward than the second holder 25B in the front-back direction X. The third connecting box 46C is located more forward than the third holder 25C in the front-back direction X. The fourth connecting box 46D is located more rearward than the fourth holder 25D in the front-back direction X. This can suitably reduce a difference between a flow path length from the first liquid reservoir 31 to the first connecting box 46A and a flow path length from the first liquid reservoir 31 to the second connecting box 46B. Specifically, a difference in length between the first pipe 43A and the second pipe 43B can be reduced suitably. Likewise, this can suitably reduce a difference between a flow path length from the first liquid reservoir 31 to the third connecting box 46C and a flow path length from the first liquid reservoir 31 to the fourth connecting box 46D. Specifically, a difference in length between the third pipe 43C and the fourth pipe 43D can be reduced suitably. Moreover, this can suitably reduce a difference between a flow path length from the second liquid reservoir 32 to the first connecting box 46A and a flow path length from the second liquid reservoir 32 to the second connecting box 46B. Specifically, a difference in length between the fifth pipe 44A and the sixth pipe 44B can be reduced suitably. Moreover, this can suitably reduce a difference between a flow path length from the second liquid reservoir 32 to the third connecting box 46C and a flow path length from the second liquid reservoir 32 to the fourth connecting box 46D. Specifically, a difference in length between the seventh pipe 44C and the eighth pipe 44D can be reduced suitably.

The substrate treating apparatus 1 includes the first joint 47A, the second joint 47B, the third joint 47C, and the fourth joint 47D. The first joint 47A is accommodated in the first connecting box 46A. The first joint 47A couples the first distributing portion 41 to the first liquid supplying unit 27A. The second joint 47B is accommodated in the second connecting box 46B. The second joint 47B couples the first distributing portion 41 to the second liquid supplying unit 27B. The third joint 47C is accommodated in the third connecting box 46C. The third joint 47C couples the first distributing portion 41 to the third liquid supplying unit 27C. The fourth joint 47D is accommodated in the fourth connecting box 46D. The fourth joint 47D couples the first distributing portion 41 to the fourth liquid supplying unit 27D. Consequently, the first distributing portion 41 can be suitably attached to and detached from the first to fourth liquid supplying units 27A to 27D in the first to fourth connecting boxes 46A to 46D, respectively. For example, the first distributing portion 41 can be suitably attached to and detached from the first liquid supplying unit 27A in the first connecting box 46A.

The substrate treating apparatus 1 includes the fifth joint 48A, the sixth joint 48B, the seventh joint 48C, and the eighth joint 48D. The fifth joint 48A is accommodated in the first connecting box 46A. The fifth joint 48A couples the second distributing portion 42 to the first liquid supplying unit 27A. The sixth joint 48B is accommodated in the second connecting box 46B. The sixth joint 48B couples the second distributing portion 42 to the second liquid supplying unit 27B. The seventh joint 48C is accommodated in the third connecting box 46C. The seventh joint 48C couples the second distributing portion 42 to the third liquid supplying unit 27C. The eighth joint 48D is accommodated in the fourth connecting box 46D. The eighth joint 48D couples the second distributing portion 42 to the fourth liquid supplying unit 27D. Consequently, the second distributing portion 42 can be suitably attached to and detached from the first to fourth liquid supplying units 27A to 27D in the first to fourth connecting boxes 46A to 46D, respectively.

The substrate treating apparatus 1 further includes the foot board 57. The foot board 57 is located in the upper space 39. The foot board 57 is substantially flat. As a result, a user of the substrate treating apparatus 1 can get on the foot board 57. Accordingly, the user can perform maintenance on the foot board 57, for example.

The foot board 57 is located near the first connecting box 46A. Accordingly, the user can access the first connecting box 46A easily. Consequently, the user can perform operation of attaching and detaching the first distributing portion 41 to and from the first liquid supplying unit 27A on the foot board 57. The user can perform operation of attaching and detaching the second distributing portion 42 to and from the first liquid supplying unit 27A on the foot board 57. Likewise, the foot board 57 is located near the second connecting box 46B, the third connecting box 46C, and the fourth connecting box 46D. Consequently, the user can perform operation of attaching and detaching the first and second distributing portions 41 and 42 to and from the second to fourth liquid supplying units 27B to 27D on the foot board 57.

The first foot board 57 extends from the first connecting box 46A to the fourth connecting box 46D while passing between the second connecting box 46B and the third connecting box 46C. Accordingly, the user can move among the first to fourth connecting boxes 46A to 46D easily.

The foot board 57 is located above at least part of the first distributing portion 41. Accordingly, the foot board 57 protects the first distributing portion 41 suitably.

The foot board 57 is located above at least part of the second distributing portion 42. Accordingly, the foot board 57 protects the second distributing portion 42 suitably.

This invention is not limited to the foregoing examples, but may be modified as follows.

In the present embodiment, rightward is one example of the first lateral side in the present invention and leftward is one example of the second lateral side in the present invention. However, the present invention is not limited to this. That is, leftward may be one example of the first lateral side in the present invention and rightward may be one example of the second lateral side in the present invention. Specifically, the first treating unit 21A1 may be located leftward of the transportation space 12A, and the second treating unit 21B1 and the first liquid reservoir 31 may be located rightward of the transportation space 12A.

Figure 9:
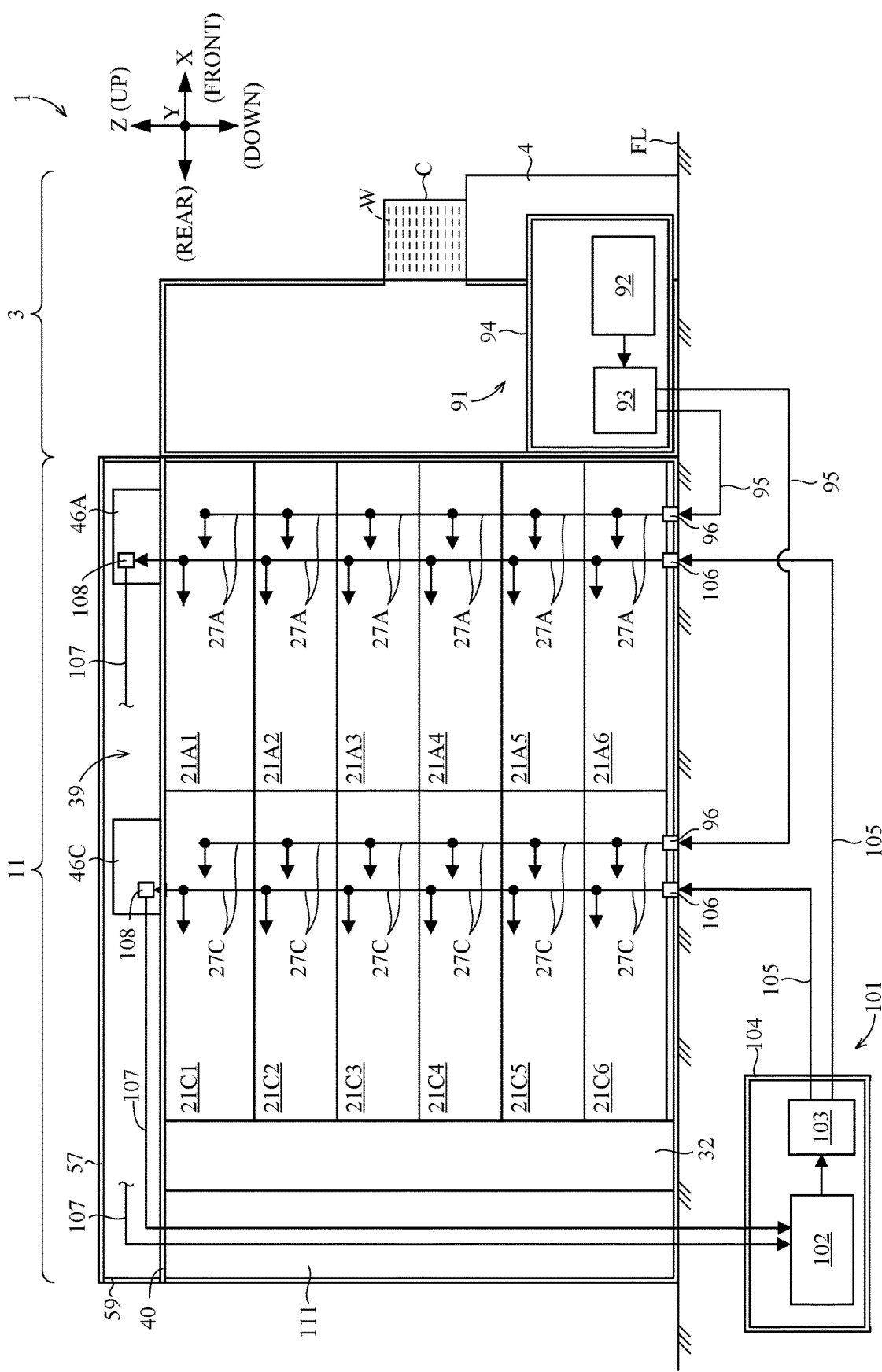
FIG. 9 is a right side view of a substrate treating apparatus according to one modification.

In the embodiment, the substrate treating apparatus 1 may further include another reservoir in addition to the first liquid reservoir 31 and the second liquid reservoir 32. FIG. 9 is a right side view of a substrate treating apparatus 1 according to one modification. Components identical to those of the embodiment are shown with the same signs, and will not particularly be described. FIG. 9 omits illustration of the first distributing portion 41 and the second distributing portion 42 for convenience.

The substrate treating apparatus 1 according to this modification includes a third liquid reservoir 91. The third liquid reservoir 91 is located in an indexer 3. The third liquid reservoir 91 stores a treatment liquid to be distributed to first to fourth treating units 21A to 21D.

The treatment liquid stored in the third liquid reservoir 91 is different in type from a treatment liquid stored in the first liquid reservoir 31. The treatment liquid stored in the third liquid reservoir 91 is different in type from a treatment liquid stored in the second liquid reservoir 32. The treatment liquid stored in the third liquid reservoir 91 is different in composition from a treatment liquid stored in the first liquid reservoir 31. The treatment liquid stored in the third liquid reservoir 91 is different in composition from a treatment liquid stored in the second liquid reservoir 32.

The treatment liquid stored in the third liquid reservoir 91 corresponds to a third treatment liquid. The third treatment liquid is classified to an alkaline liquid (alkaline chemical), for example. The third treatment liquid includes, for example, at least one selected from ammonia/hydrogen peroxide solution (SC1), an ammonia water, an ammonium fluoride solution, and tetramethylammonium hydroxide (TMAH).

The third liquid reservoir 91 includes a tank 92, a pump 93, and a cabinet 94. The tank 92 stores a treatment liquid (specifically, third treatment liquid). The pump 93 is in communication with the tank 92. For example, the pump 93 is connected to the tank 92. The cabinet 94 accommodates the tank 92 and the pump 93.

The substrate treating apparatus 1 includes a third distributing portion 95. The third distributing portion 95 distributes a treatment liquid from the third liquid reservoir 91 to the first to fourth treating units 21A to 21D.

Specifically, the third distributing portion 95 is in communication with the pump 93. For example, the third distributing portion 95 is connected to the pump 93. The third distributing portion 95 extends from a bottom of the indexer 3 to a bottom of a treating block 11. The distributing portion 95 is provided in an underground pit, not shown, for example. The underground pit is formed below a floor level FL on which the indexer 3 and the treating block 11 are installed. The third distributing portion 95 is connected to first to fourth liquid supplying units 27A to 27D via joints 96.

The substrate treating apparatus 1 according to this modification includes a fourth liquid reservoir 101. The fourth liquid reservoir 101 is located outside of the indexer 3 and the treating block 11. The fourth liquid reservoir 101 is provided in the underground pit, for example. The fourth liquid reservoir 101 stores a treatment liquid to be distributed to the first to fourth treating units 21A to 21D.

The treatment liquid stored in the fourth liquid reservoir 101 is different in type from the treatment liquid stored in the first liquid reservoir 31. The treatment liquid stored in the fourth liquid reservoir 101 is different in type from the treatment liquid stored in the second liquid reservoir 32. The treatment liquid stored in the fourth liquid reservoir 101 is different in type from the treatment liquid stored in the third liquid reservoir 91. The treatment liquid stored in the fourth liquid reservoir 101 is different in composition from the treatment liquid stored in the first liquid reservoir 31. The treatment liquid stored in the fourth liquid reservoir 101 is different in composition from the treatment liquid stored in the second liquid reservoir 32. The treatment liquid stored in the fourth liquid reservoir 101 is different in composition from the treatment liquid stored in the third liquid reservoir 91.

The treatment liquid stored in the fourth liquid reservoir 101 corresponds to a fourth treatment liquid. The fourth treatment liquid is classified to a cleaning liquid, for example. The fourth treatment liquid is, for example, deionized water.

The fourth liquid reservoir 101 includes a tank 102, a pump 103, and a cabinet 104. The tank 102 stores a treatment liquid (specifically, fourth treatment liquid). The pump 103 is in communication with the tank 102. For example, the pump 103 is connected to the tank 102. The cabinet 104 accommodates the tank 102 and the pump 103.

The substrate treating apparatus 1 includes a fourth distributing portion 105. The fourth distributing portion 105 distributes a treatment liquid from the fourth liquid reservoir 101 to the first to fourth treating units 21A to 21D.

Specifically, the fourth distributing portion 105 is in communication with the pump 103. For example, the fourth distributing portion 105 is connected to the pump 103. The fourth distributing portion 105 extends from the fourth liquid reservoir 101 to the bottom of the treating block 11. The fourth distributing portion 105 is provided in the underground pit, for example. The fourth distributing portion 105 is connected to the first to fourth liquid supplying units 27A to 27D via joints 106.

The substrate treating apparatus 1 further includes a return portion 107. The return portion 107 returns the treatment liquid from the first to fourth treating units 21A to 21D to the fourth liquid reservoir 101.

Specifically, the return portion 107 is in communication with the first to fourth liquid supplying units 27A to 27D. For example, the return portion 107 is connected to the first to fourth liquid supplying units 27A to 27D. The return portion 107 is connected to the first to fourth liquid supplying units 27A to 27D in the first to fourth connecting boxes 46A to 46D, respectively. The return portion 107 is connected to the first to fourth liquid supplying units 27A to 27D via joints 108. The return portion 107 is installed in the upper space 39. The return portion 107 extends rearward from the first to fourth connecting boxes 46A to 46D.

The treating block 11 includes an interface unit 111. The interface unit 111 is positioned in a rear part of the treating block 11. The interface unit 111 is located behind the transportation space 12, the treating unit 21, the first liquid reservoir 31, and the second liquid reservoir 32. The interface unit 111 extends in the vertical direction Z. The interface unit 111 extends from the upper space 39 to the bottom of the treating block 11.

The return portion 107 enters the interface unit 111 from the upper space 39. The return portion 107 extends downward within the interface unit 111. The return portion 107 exits outside of the interface unit 111 (e.g., underground pit) through the bottom of the interface unit 111. Then, the return portion 107 enters the fourth reservoir 101. The return portion 107 is in communication with the tank 102. For example, the return portion 107 is connected to the tank 102.

Here, the treating block 11 may further includes have a power distribution unit, not shown. The power distribution unit is located behind the treating block 11, for example. The power distribution unit is located near the interface unit 111, for example. The power distribution unit controls an electrical source of the substrate treating apparatus 1. The power distribution unit includes one or more switches, for example. The switches each turn power on and off to an electrical device of the substrate treating apparatus 1.

In the embodiment, the first liquid reservoir 31 stores the first treatment liquid. However, the present invention is not limited to this. The first liquid reservoir 31 may store any one of the second treatment liquid, the third treatment liquid, and the fourth treatment liquid. Likewise, in the embodiment, the second liquid reservoir 32 stores the second treatment liquid. However, the present invention is not limited to this. The second liquid reservoir 32 may store any one of the first treatment liquid, the third treatment liquid, and the fourth treatment liquid.

In the embodiment, part of the substrate platform 16A may be located in the indexer 3.

In the embodiment, the foot board 57 may be located above the entire first distributing portion 41. The foot board 57 may be located above the entire second distributing portion 42. The foot board 57 may be located above the entire exhaust pipes 53 to 55.

In the embodiment, the foot board 57 is not located above the first to fourth connecting boxes 46A to 46D. However, the present invention is not limited to this. The foot board 57 may be located above at least part of the first to fourth connecting boxes 46A to 46D. For example, the foot board 57 may be located above the entire first to fourth connecting boxes 46A to 46D. The foot board 57 may include a panel, not shown, configured to open and close above the first connecting box 46A. When the panel opens, the user can access the first connecting box 46A easily. When the panel closes, the panel protects the first connecting box 46A. Likewise, the foot board 57 may include panels, not shown, configured to open and close above the second to fourth connecting boxes 46B to 46D, respectively.

In the embodiment, the number of transportation spaces 12 of the treating block 11 is two. However, the present invention is not limited to this. The number of transportation spaces 12 of the treating block 11 may be one or may be two or more.

In the embodiment, the number of transport mechanisms 13 of the treating block 11 is two. However, the present invention is not limited to this. The number of transport mechanisms 13 of the treating block 11 may be one or may be more than two.

In the embodiment, the substrate treating apparatus 1 includes the third treating unit 21C1 and the fourth treating unit 21D1. However, the present invention is not limited to this. For example, the third treating unit 21C1 and the fourth treating unit 21D1 may be omitted.

In the embodiment, the number of treating units 21 that are arranged rightward of the transportation space 12A and align in the front-back direction X is two. However, the present invention is not limited to this. The number of treating units 21 that are arranged rightward of the transportation space 12A and align in the front-back direction X may be one or may be more than two. Likewise, the number of treating units 21 that are arranged leftward of the transportation space 12A and align in the front-back direction X may be one or may be more than two.

In the embodiment, the number of first treating units 21A is six. However, the present invention is not limited to this. The number of first treating units 21A may be one or more and less than six, or may be more than six.

In the embodiment, the number of treating units 21 that align in the vertical direction Z is six. However, the present invention is not limited to this. The number of treating units 21 that align in the vertical direction Z may be one or more and less than six or may be more than six.

The embodiment and the modifications described above may be variable appropriately by replacing or combining the unit of the embodiment and modifications with other thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus, comprising:
   an indexer; and
   a treating block located behind the indexer and is connected to the indexer,
   the treating block including:
      a transportation space extending in a front-back direction;
      a transport mechanism located in the transportation space and configured to be movable in parallel in the front-back direction and to transport a substrate;
      a first treating unit arranged on a first lateral side of the transportation space and configured to treat a substrate;
      a second treating unit arranged on a second lateral side of the transportation space and configured to treat a substrate; and
      a first liquid reservoir configured to store a treatment liquid to be distributed to the first treating unit and the second treating unit,
   the first treating unit including:
      a first holder configured to hold a substrate; and
      a first liquid supplying unit configured to supply a treatment liquid to a substrate held by the first holder,
   the second treating unit including:
      a second holder configured to hold a substrate; and
      a second liquid supplying unit configured to supply a treatment liquid to a substrate held by the second holder,
   the transport mechanism transporting a substrate to the first holder and the second holder,
   the first holder having a center point positioned more rearward than a middle point of the first treating unit in plan view,
   the second holder having a center point positioned more forward than a middle point of the second treating unit in plan view,
   the second treating unit having a front end located more rearward than a front end of the first treating unit and more forward than a rear end of the first treating unit, and
   the first liquid reservoir being located on the second lateral side of the transportation space and adjacent to and in front of the second treating unit.

2. The substrate treating apparatus according to claim 1, wherein
   the center point of the second holder is located more forward than the center point of the first holder.

3. The substrate treating apparatus according to claim 1, wherein
   the first liquid reservoir has a front end located at substantially the same position as the front end of the first treating unit in the front-back direction.

4. The substrate treating apparatus according to claim 1, wherein
   the first treating unit is located adjacent to and behind the indexer, and
   the first liquid reservoir is located adjacent to and behind the indexer.

5. The substrate treating apparatus according to claim 1, wherein
   the second treating unit has a configuration equal to a configuration in which the first treating unit is rotated by 180 degrees about a vertical axis.

6. The substrate treating apparatus according to claim 1, further comprising:
   a substrate platform configured to place thereon a substrate transported between the indexer and the transport mechanism, wherein
   at least part of the substrate platform is located in the transportation space.

7. The substrate treating apparatus according to claim 6, wherein
   the substrate platform is located between the first treating unit and the first liquid reservoir.

8. The substrate treating apparatus according to claim 1, further comprising:
   a third treating unit located on the first lateral side of the transportation space and adjacent to and behind the first treating unit and configured to treat a substrate; and
   a fourth treating unit located on the second lateral side of the transportation space and adjacent to and behind the second treating unit and configured to treat a substrate,
   the third treating unit including:
      a third holder configured to hold a substrate; and
      a third liquid supplying unit configured to supply a treatment liquid to a substrate held by the third holder,
   the fourth treating unit including:
      a fourth holder configured to hold a substrate; and
      a fourth liquid supplying unit configured to supply a treatment liquid to a substrate held by the fourth holder, wherein
   the transport mechanism transports a substrate to the third holder and the fourth holder,
   the first liquid reservoir stores a treatment liquid to be distributed to the third treating unit and the fourth treating units,
   the third holder has a center point positioned more rearward than a middle point of the third treating unit in plan view,
   the fourth holder has a center point positioned more forward than a middle point of the fourth treating unit in plan view, and
   the fourth treating unit has a front end located more rearward than a front end of the third treating unit and more forward than a rear end of the third treating unit.

9. The substrate treating apparatus according to claim 8, wherein
   the third treating unit has a configuration equal to a configuration of the first treating unit, and the fourth treating unit has a configuration equal to a configuration in which the first treating unit is rotated by 180 degrees about a vertical axis.

10. The substrate treating apparatus according to claim 8, further comprising:
a second liquid reservoir configured to store a treatment liquid to be distributed to the first treating unit, the second treating unit, the third treating unit, and the fourth treating unit, wherein
the second liquid reservoir is located on the first lateral side of the transportation space and adjacent to and behind the third treating unit.

11. The substrate treating apparatus according to claim 10, wherein
the second liquid reservoir has a rear end located at substantially the same position as a rear end of the fourth treating unit in the front-back direction.

12. The substrate treating apparatus according to claim 10, wherein
the treatment liquid stored in the second liquid reservoir is different in type from the treatment liquid stored in the first liquid reservoir.

13. The substrate treating apparatus according to claim 10, further comprising:
an upper space formed above the transportation space, the first treating unit, the second treating unit, the third treating unit, the fourth treating unit, the first liquid reservoir, and the second liquid reservoir;
a first distributing portion provided in the upper space and configured to distribute a treatment liquid from the first liquid reservoir to the first treating unit, the second treating unit, the third treating unit, and the fourth treating unit; and
a second distributing portion provided in the upper space and configured to distribute a treatment liquid from the second liquid reservoir to the first treating unit, the second treating unit, the third treating unit, and the fourth treating unit.

14. The substrate treating apparatus according to claim 13, wherein
the second distributing portion has a configuration equal to a configuration in which the first distributing portion is rotated by 180 degrees in plan view.

15. The substrate treating apparatus according to claim 13, further comprising:
a first connecting box located above the first treating unit;
a second connecting box located above the second treating unit;
a third connecting box located above the third treating unit; and
a fourth connecting box located above the fourth treating unit, wherein
the first distributing portion extends from the first liquid reservoir to the first connecting box, the second connecting box, the third connecting box, and the fourth connecting box, and
the second distributing portion extends from the second liquid reservoir to the first connecting box, the second connecting box, the third connecting box, and the fourth connecting box.

16. The substrate treating apparatus according to claim 15, wherein
the first connecting box is located more forward than the first holder in the front-back direction,
the second connecting box is located more rearward than the second holder in the front-back direction,
the third connecting box is located more forward than the third holder in the front-back direction, and
the fourth connecting box is located more rearward than the fourth holder in the front-back direction.

17. The substrate treating apparatus according to claim 15, further comprising:
a first joint accommodated in the first connecting box and configured to couple the first distributing portion to the first liquid supplying unit;
a second joint accommodated in the second connecting box and configured to couple the first distributing portion to the second liquid supplying unit;
a third joint accommodated in the third connecting box and configured to couple the first distributing portion to the third liquid supplying unit; and
a fourth joint accommodated in the fourth connecting box and configured to couple the first distributing portion to the fourth liquid supplying unit.

18. The substrate treating apparatus according to claim 15, further comprising:
a substantially flat foot board located in the upper space.

19. The substrate treating apparatus according to claim 18, wherein
the foot board is located near the first connecting box, the second connecting box, the third connecting box, and the fourth connecting box.

20. The substrate treating apparatus according to claim 18, wherein
the foot board is located above at least part of the first distributing portion.

* * * * *